(12) United States Patent
Takahashi et al.

(10) Patent No.: US 9,287,158 B2
(45) Date of Patent: Mar. 15, 2016

(54) SUBSTRATE PROCESSING APPARATUS

(75) Inventors: Tamami Takahashi, Tokyo (JP); Mitsuhiko Shirakashi, Tokyo (JP); Kenya Ito, Tokyo (JP); Kazuyuki Inoue, Tokyo (JP); Kenji Yamaguchi, Tokyo (JP); Masaya Seki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 630 days.

(21) Appl. No.: 11/630,512

(22) PCT Filed: Apr. 18, 2006

(86) PCT No.: PCT/JP2006/308490
§ 371 (c)(1),
(2), (4) Date: Nov. 20, 2007

(87) PCT Pub. No.: WO2006/112530
PCT Pub. Date: Oct. 26, 2006

(65) Prior Publication Data
US 2008/0200100 A1 Aug. 21, 2008

(30) Foreign Application Priority Data
Apr. 19, 2005 (JP) ................. 2005-121679

(51) Int. Cl.
| | |
|---|---|
| *B44C 1/22* | (2006.01) |
| *C03C 15/00* | (2006.01) |
| *C03C 25/68* | (2006.01) |
| *H01L 21/302* | (2006.01) |
| *H01L 21/461* | (2006.01) |
| *H01L 21/687* | (2006.01) |

(Continued)

(52) U.S. Cl.
CPC .......... *H01L 21/68707* (2013.01); *B24B 9/065* (2013.01); *B24B 49/04* (2013.01); *H01L 21/302* (2013.01); *H01L 21/461* (2013.01); *H01L 21/67219* (2013.01); *H01L 21/67253* (2013.01); *H01L 21/68728* (2013.01)

(58) Field of Classification Search
None
See application file for complete search history.

(56) References Cited

U.S. PATENT DOCUMENTS

| | | |
|---|---|---|
| 2002/0016074 A1 | 2/2002 | Kimura et al. |
| 2002/0052116 A1* | 5/2002 | Vepa et al. ............ 438/692 |

(Continued)

FOREIGN PATENT DOCUMENTS

| | | |
|---|---|---|
| JP | 09-076148 | 3/1997 |
| JP | 2000-084811 | 3/2000 |

(Continued)

OTHER PUBLICATIONS

Supplementary European Search Report issued Aug. 17, 2010 in European Patent Application No. 06 73 2248 corresponding to the present U.S. application.

*Primary Examiner* — Stephanie Duclair
(74) *Attorney, Agent, or Firm* — Wenderoth, Lind & Ponack, L.L.P.

(57) ABSTRACT

A substrate processing apparatus includes first and second polishing units for polishing a peripheral portion of a substrate, a primary cleaning unit for cleaning the substrate, a secondary cleaning and drying unit for drying the substrate cleaned in the primary cleaning unit, and a measurement unit for measuring the peripheral portion of the substrate. The measurement unit includes a mechanism for measurement required for polishing in the first and second polishing units, such as a diameter measurement mechanism, a cross-sectional shape measurement mechanism, or a surface condition measurement mechanism.

8 Claims, 27 Drawing Sheets

(51) Int. Cl.
 *B24B 9/06* (2006.01)
 *B24B 49/04* (2006.01)
 *H01L 21/67* (2006.01)

(56) References Cited

U.S. PATENT DOCUMENTS

2004/0166783 A1* 8/2004 Kimura et al. ................. 451/41
2004/0171269 A1  9/2004 Kondo et al.
2004/0185751 A1* 9/2004 Nakanishi et al. ............... 451/5
2006/0009127 A1* 1/2006 Sakurai et al. .................. 451/5

FOREIGN PATENT DOCUMENTS

| | | | | |
|---|---|---|---|---|
| JP | 2000084811 A | * | 3/2000 | ............ B24B 9/00 |
| JP | 2002-208572 | | 7/2002 | |
| JP | 2003-139523 | * | 5/2003 | ............ G01B 11/30 |
| JP | 2003-209075 | | 7/2003 | |
| WO | WO 2005115689 A1 | * | 12/2005 | ............ B24B 49/12 |

* cited by examiner

F I G. 4A
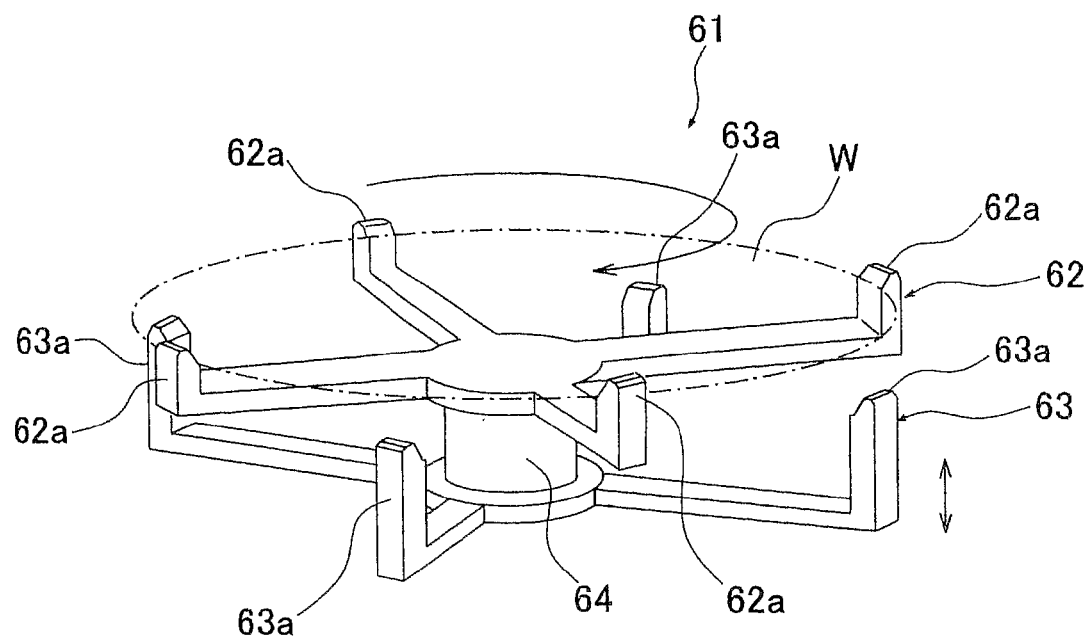
F I G. 4B
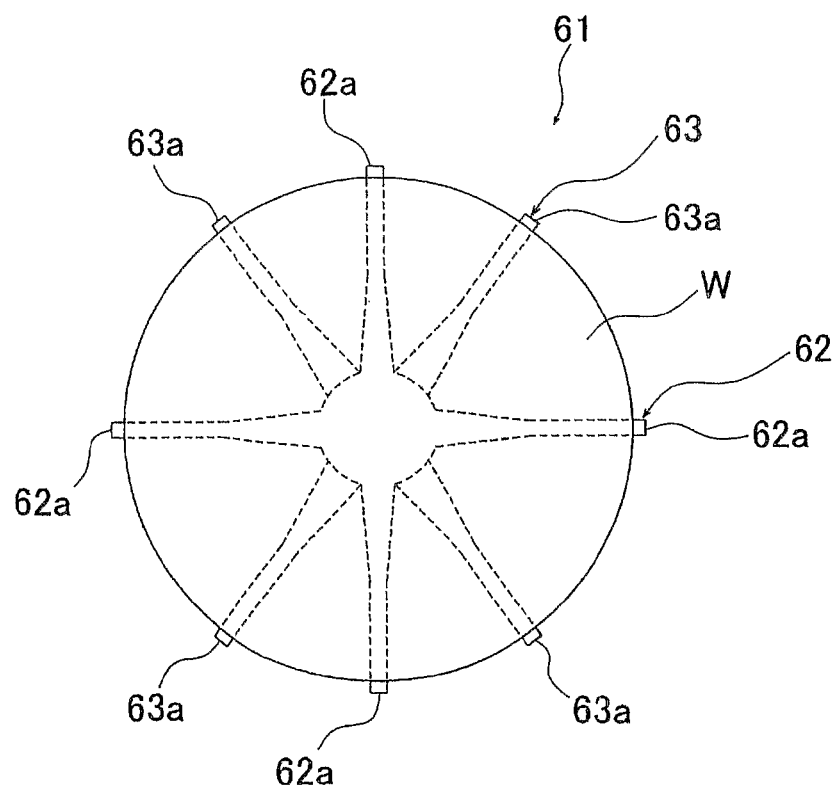

F I G. 1 1 A
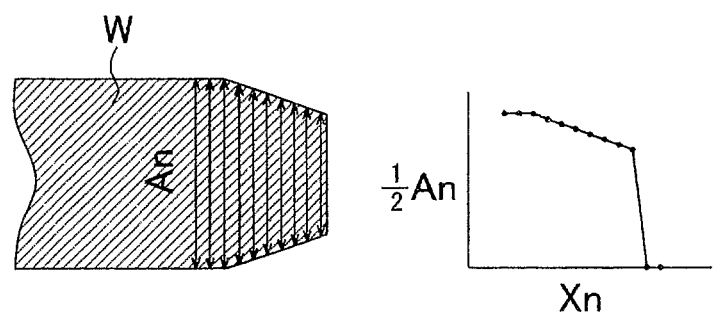
F I G. 1 1 B
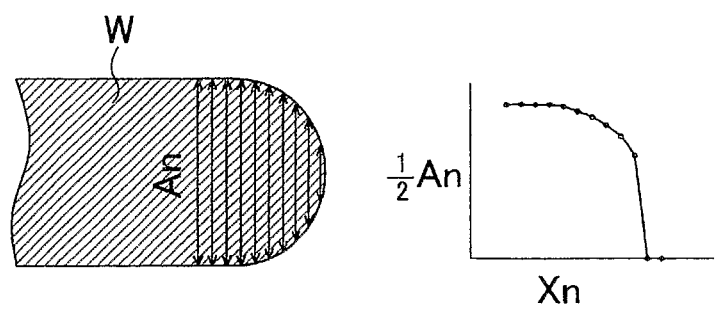

F I G. 1 2
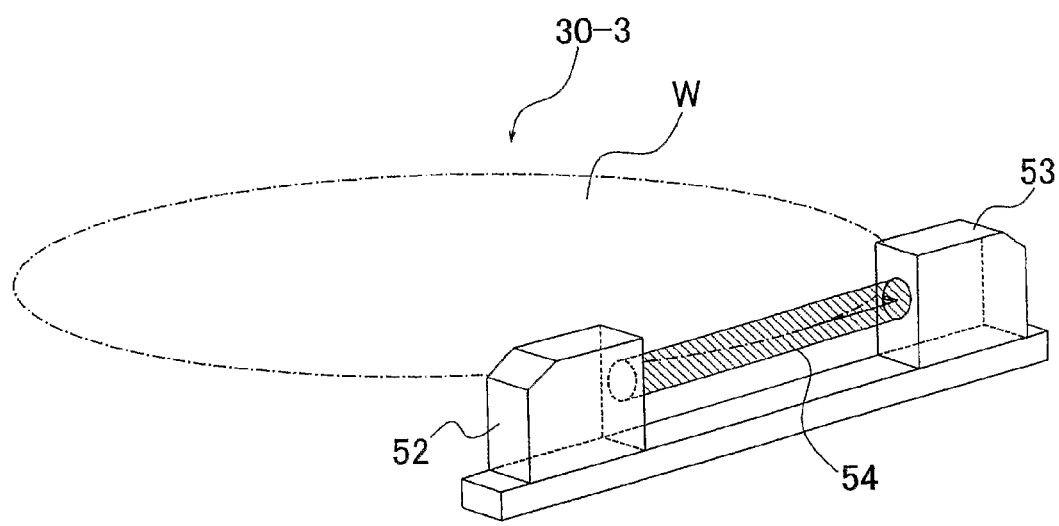

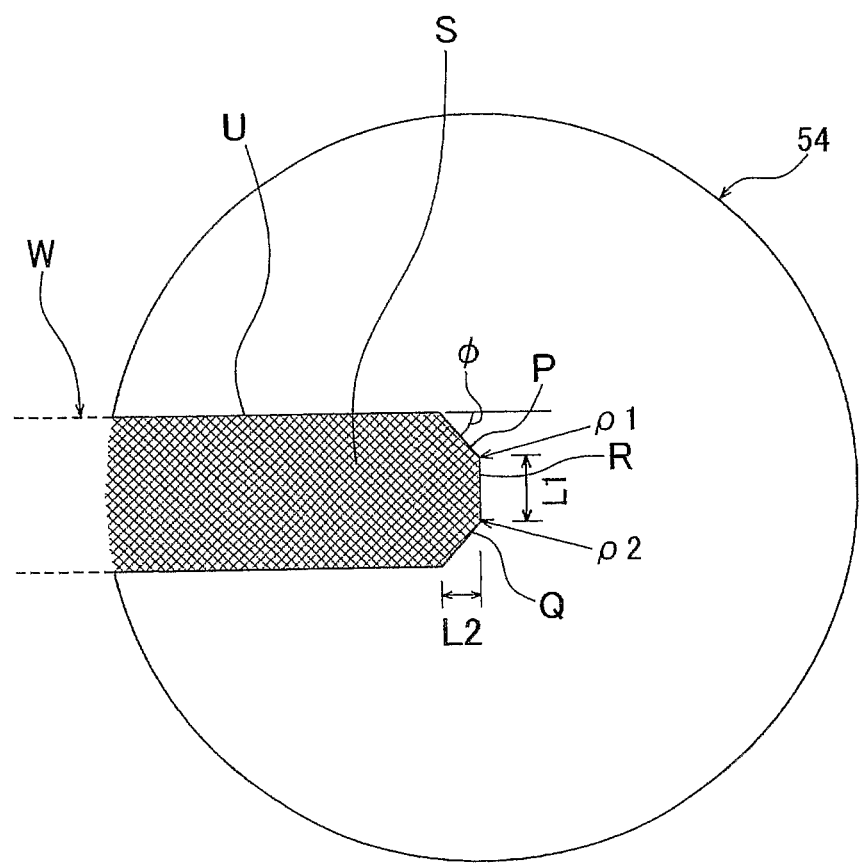
F I G. 1 3

F I G. 14
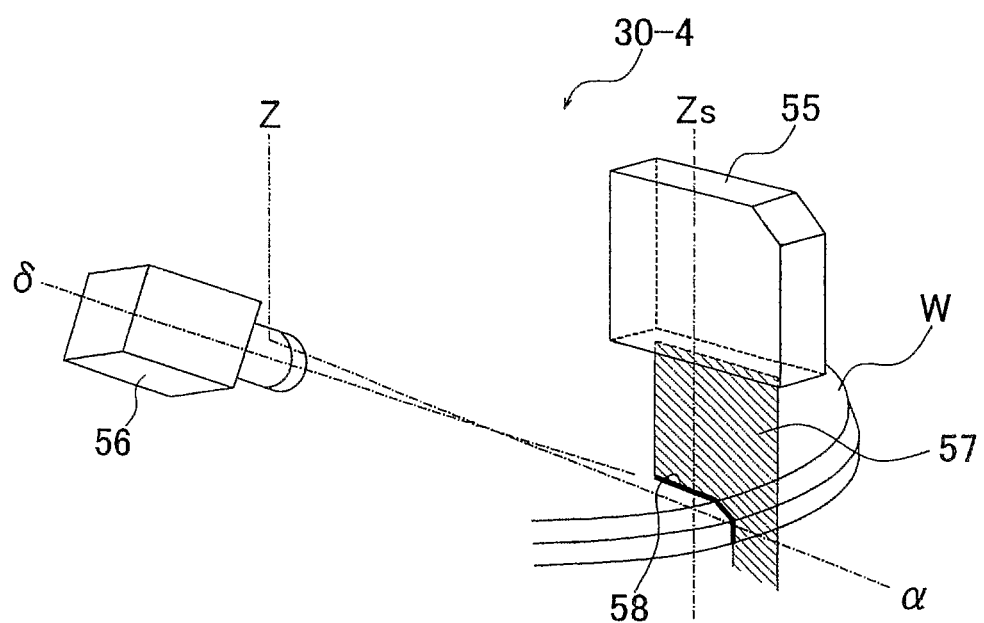

F I G. 1 5 A
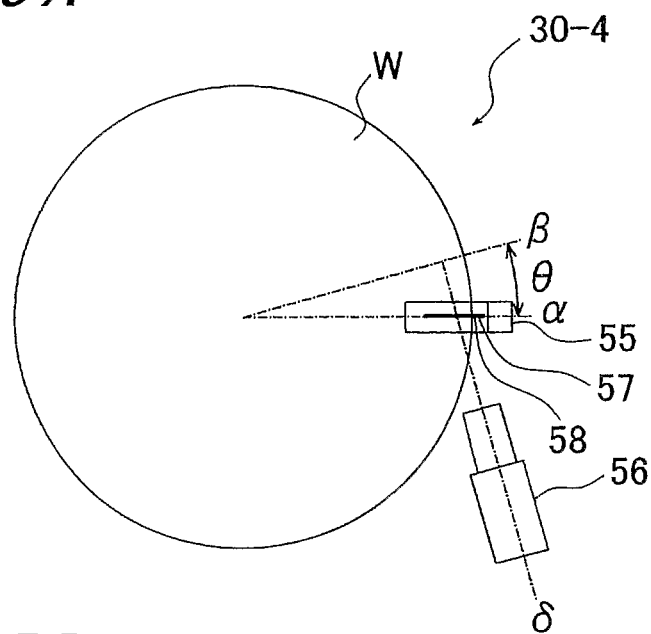
F I G. 1 5 B
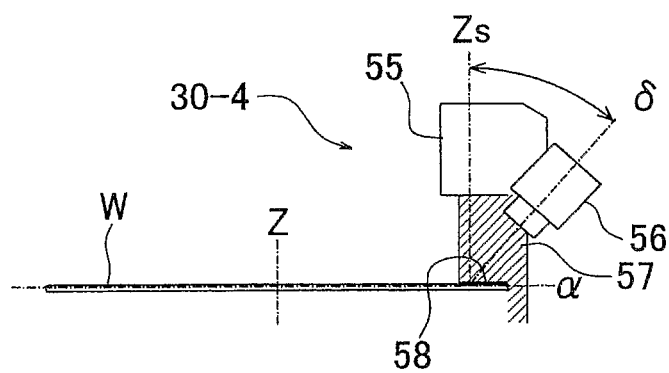
F I G. 1 5 C
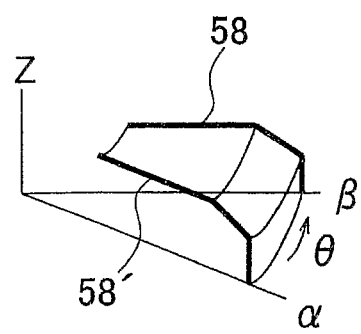

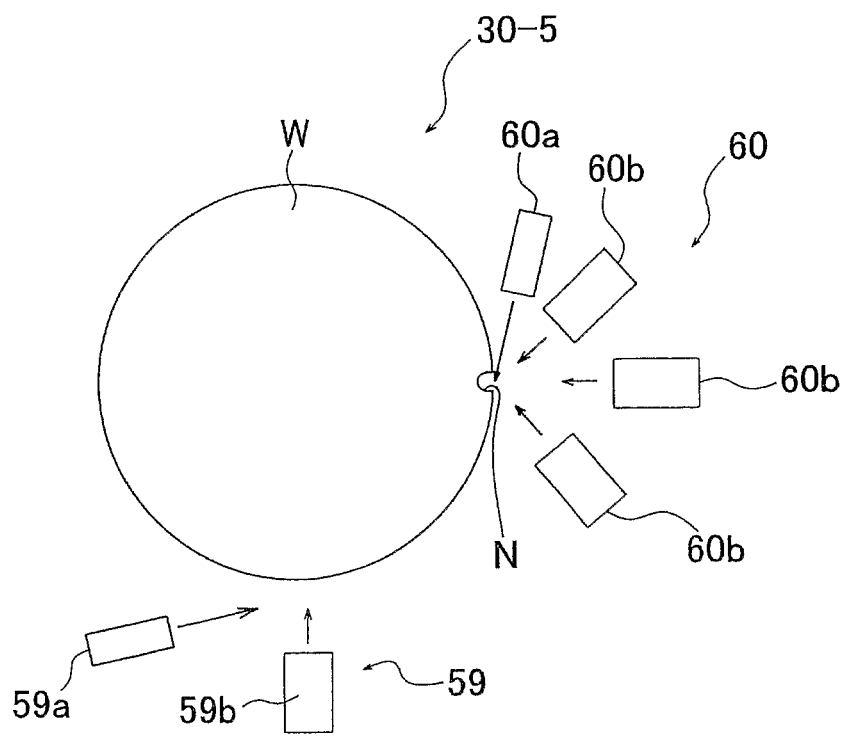
F I G. 1 6 A
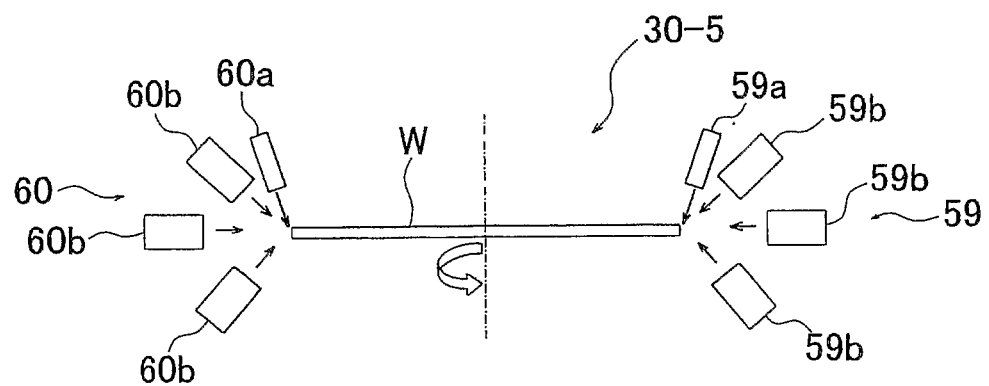
F I G. 1 6 B

F I G. 1 9
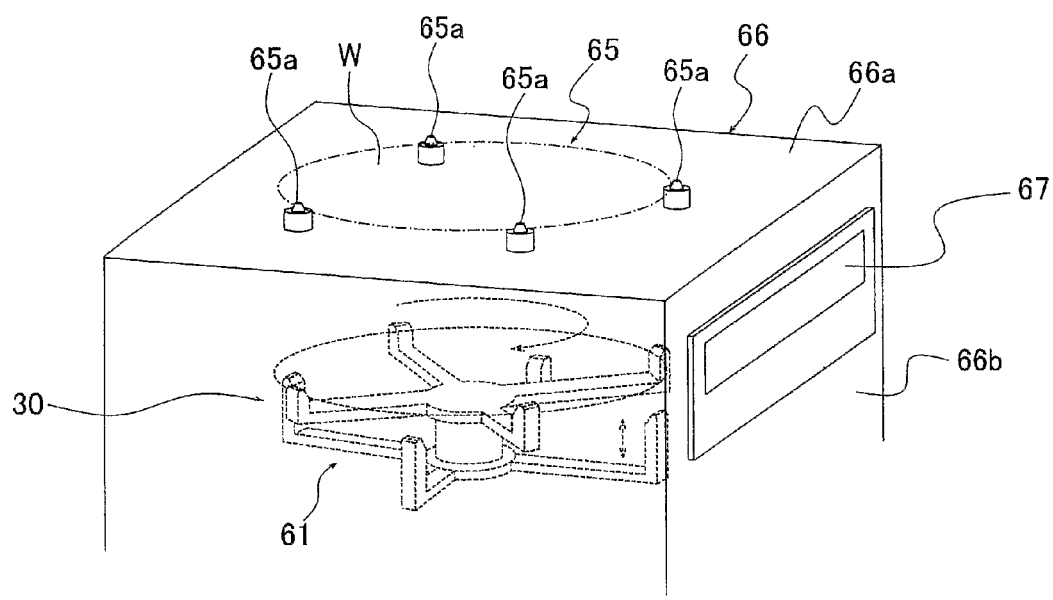

F I G. 2 2
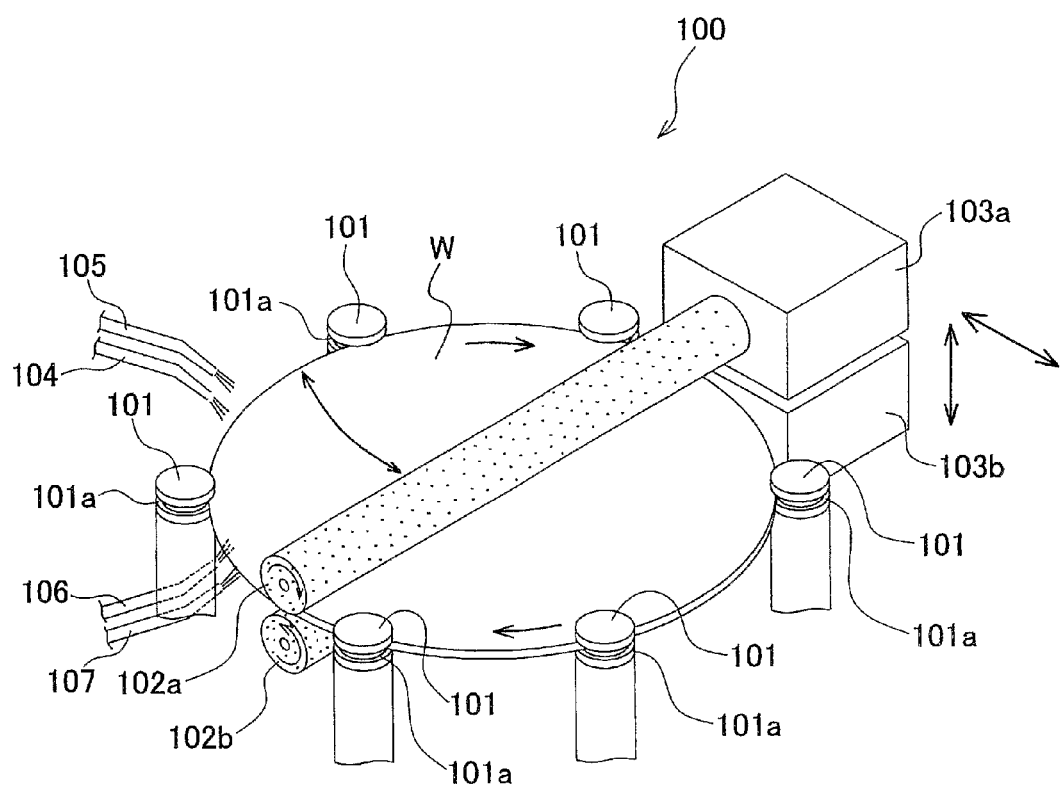

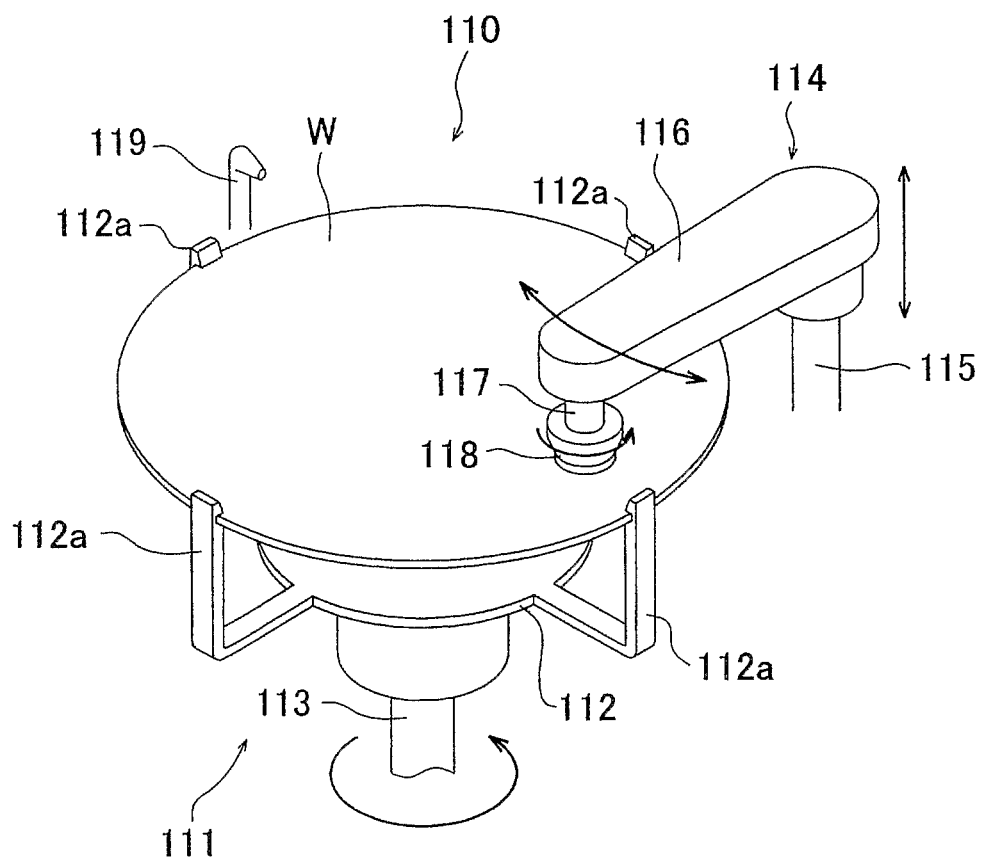
F I G. 2 3

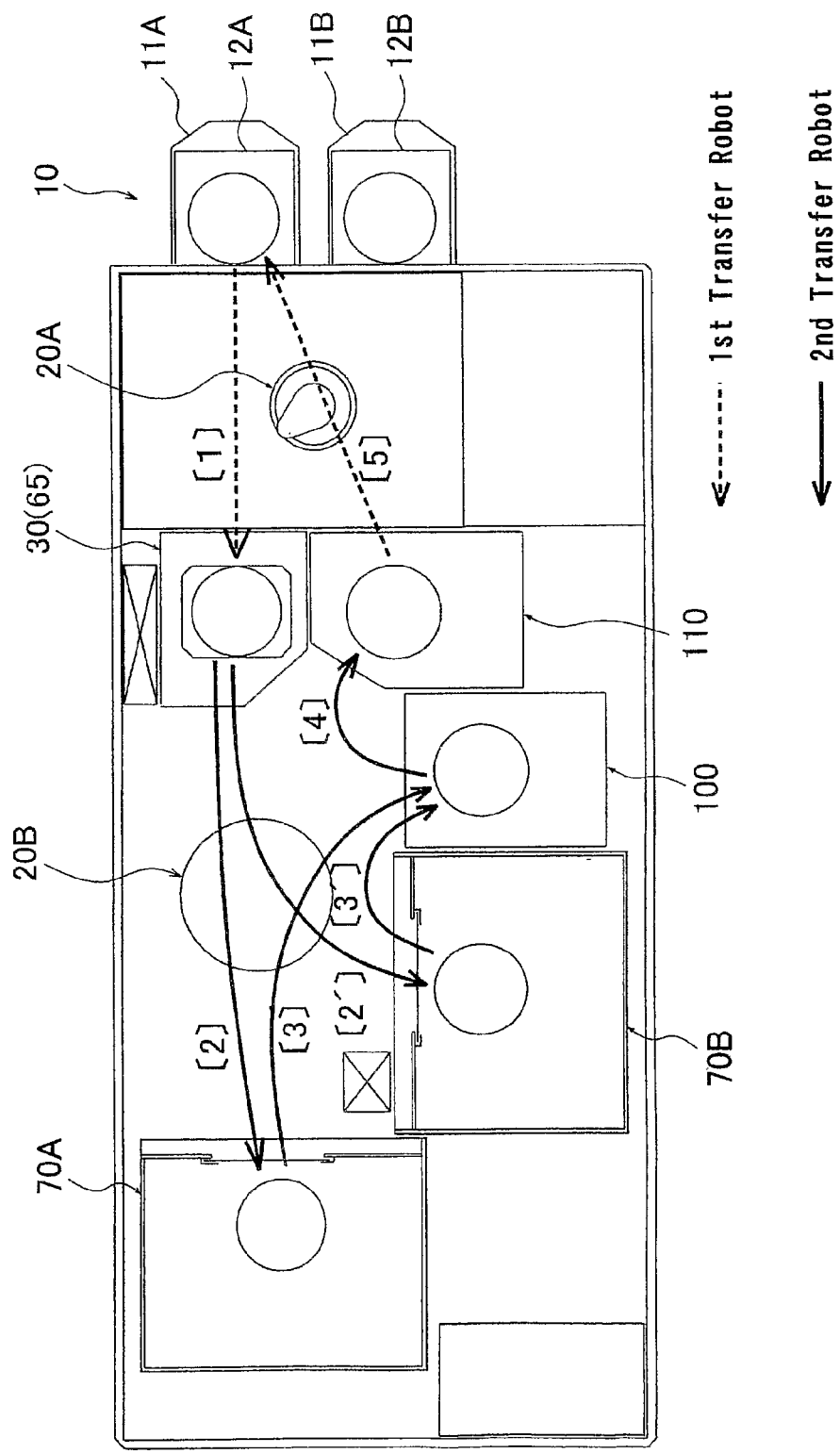

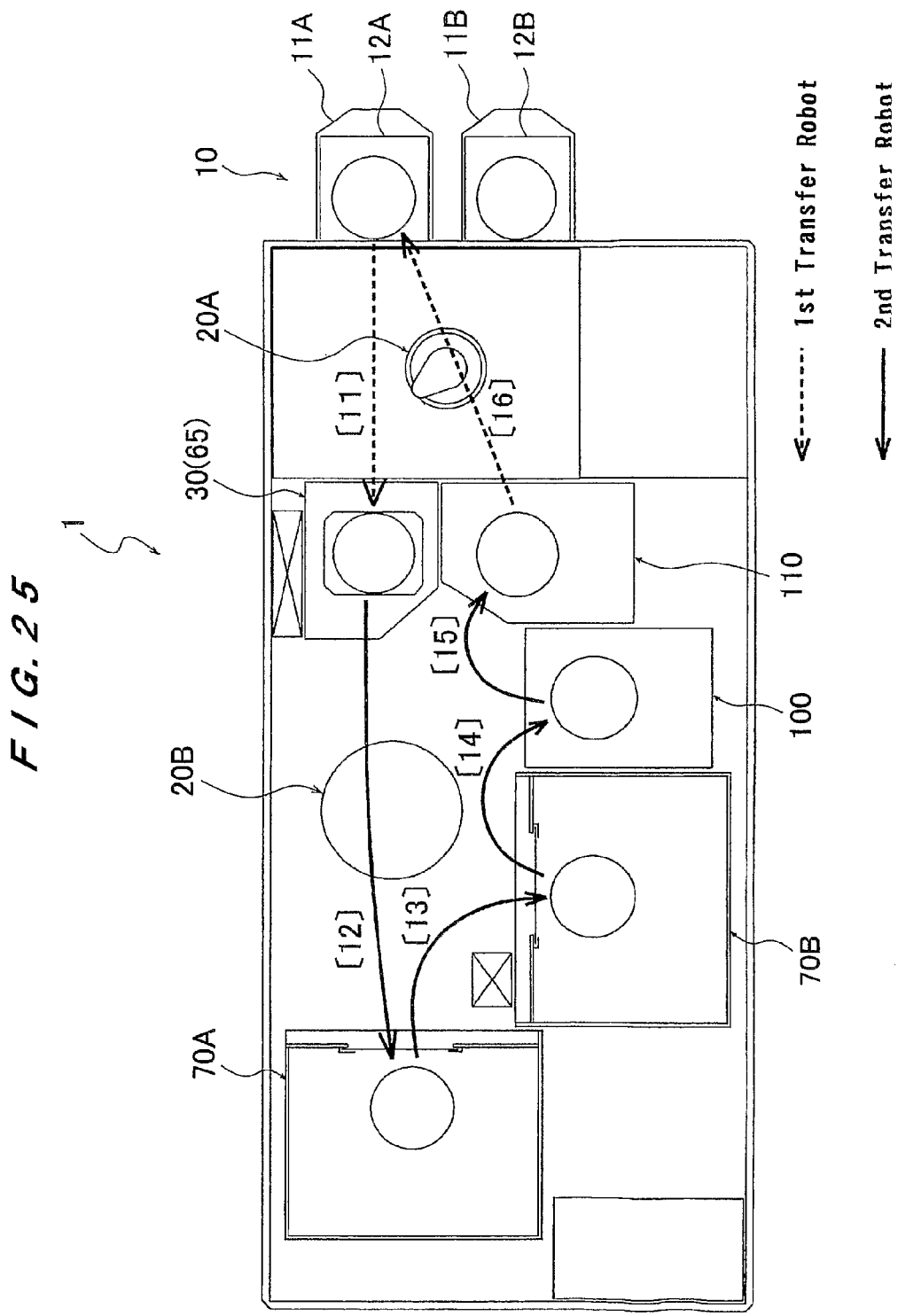

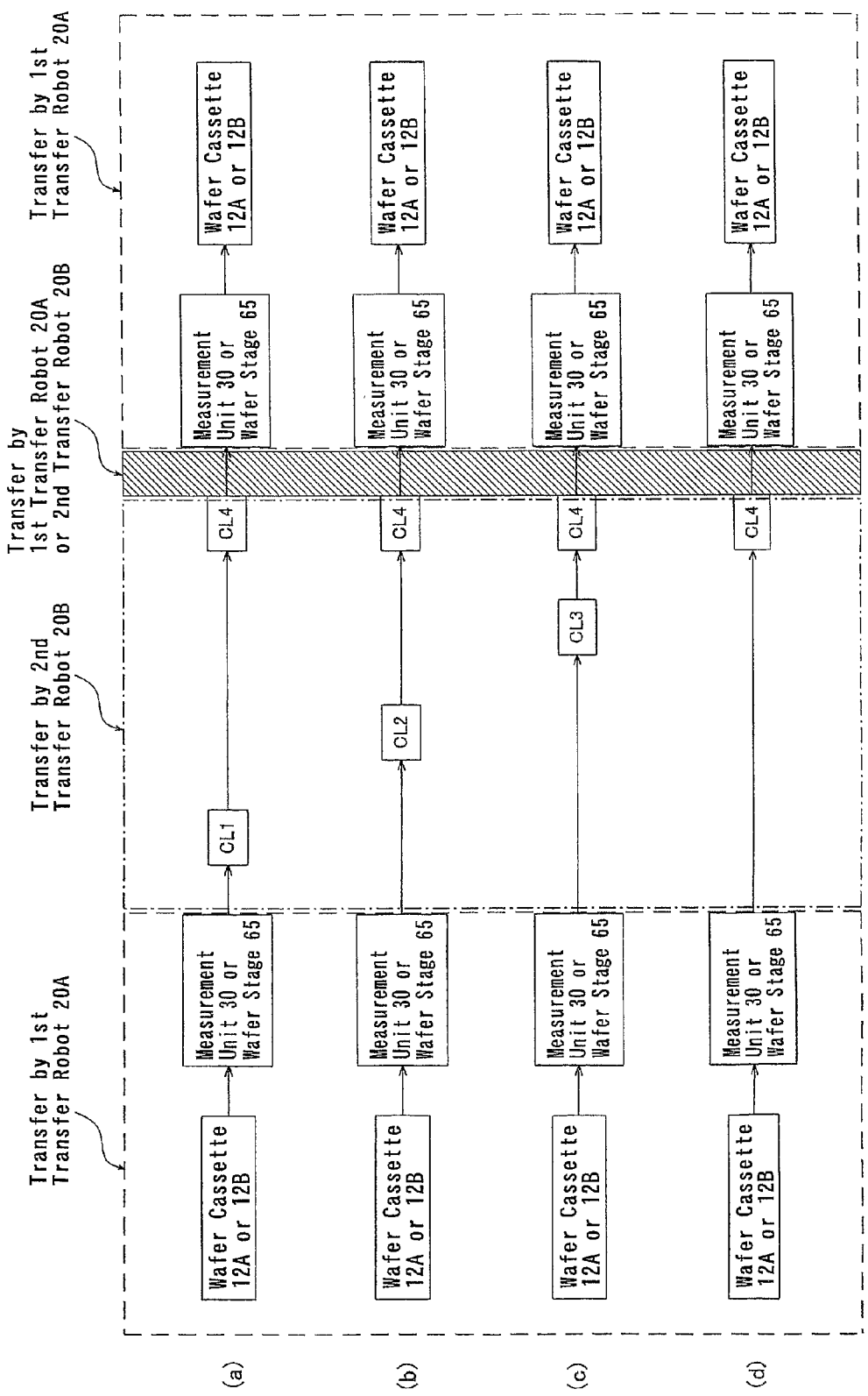

F I G. 2 7
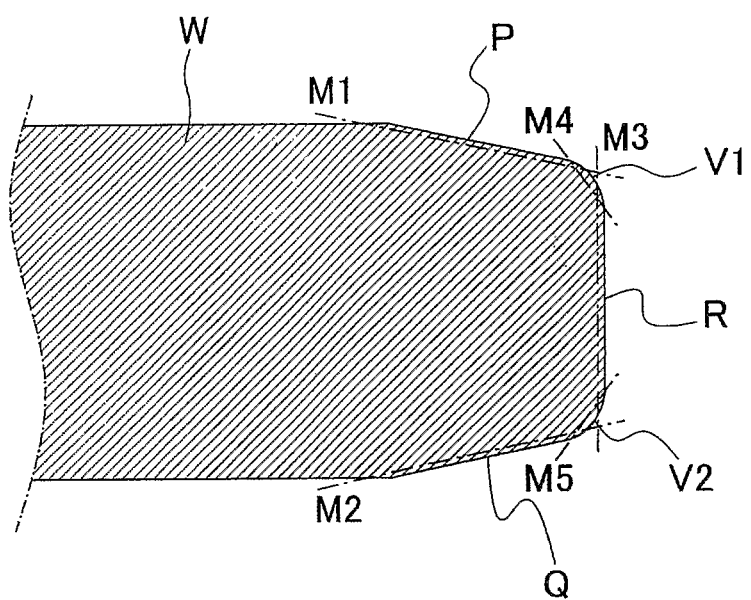

SUBSTRATE PROCESSING APPARATUS

TECHNICAL FIELD

The present invention relates to a substrate processing apparatus, and more particularly to a substrate processing apparatus having a polishing unit for polishing a peripheral portion of a substrate such as a semiconductor wafer. The present invention also relates to a substrate processing method, and more particularly to a substrate polishing method of polishing a peripheral portion of a substrate such as a semiconductor wafer. The present invention is also concerned with a substrate measuring method of measuring a peripheral portion of a substrate such as a semiconductor wafer.

BACKGROUND ART

In recent years, according to finer structures and higher integration of semiconductor devices, it has become more important to manage particles. One of, the major problems in managing particles is dust caused by surface roughness produced at a peripheral portion (a bevel portion and an edge portion) of a substrate, such as a semiconductor wafer, in a manufacturing process of semiconductor devices.

FIGS. 1A and 1B are enlarged cross-sectional views showing examples of a peripheral portion of a wafer W. FIG. 1A shows, a peripheral portion of a straight-type wafer W having a cross-section formed by a plurality of straight lines. FIG. 1B shows a peripheral portion of a round-type wafer W having a cross-section formed by a curve. In FIG. 1A, a bevel portion B of the wafer W includes an upper inclined portion P and a lower inclined portion Q, which are inclined with respect to upper and lower surfaces of an outer circumferential portion of the wafer W, respectively, and a side surface R of the outer circumferential portion of the wafer W. In FIG. 1B, a bevel portion B of the wafer W includes a portion having a curvature in a cross-section of an outer circumferential portion of the wafer W. In FIGS. 1A and 1B, an edge portion of the wafer W includes an area E located between an inner boundary of the bevel portion B and an upper surface D of the wafer W, on which semiconductor devices are formed. In the following description, a peripheral portion of a wafer includes the aforementioned bevel portion B and edge portion E.

There has heretofore been known a polishing apparatus (peripheral portion polishing apparatus) for polishing a peripheral portion of a wafer. Such a polishing apparatus has been used for shaping an outer circumferential portion of a wafer prior to a formation process of semiconductor devices. Recently, such a polishing apparatus has been used for removing films as a pollution source attached to a peripheral portion of a wafer in a formation process of semiconductor devices or for removing surface roughness produced at a peripheral portion of a wafer, for example, for separating needle projections formed after formation of deep trenches in the wafer. When objects attached to a peripheral portion of a wafer are removed in advance, it is possible to prevent contamination of wafers, which would be caused by a transfer robot for holding and transferring wafers. Further, when surface roughness is removed in advance from a peripheral portion of a wafer, it is possible to prevent dust from being produced by separation of objects formed on the peripheral portion of the wafer.

There has practically been used a substrate processing apparatus having process units including a polishing apparatus (polishing unit) for polishing a peripheral portion of a wafer, a cleaning unit for cleaning the wafer, and a drying unit for drying the wafer. This substrate processing apparatus is employed to perform a sequence of processes on a wafer which include polishing a peripheral portion of the wafer. In this case, before a wafer that has been polished in the polishing unit is introduced into a subsequent process unit, it is necessary to examine whether objects such as a film attached to the peripheral portion of the wafer have been removed or whether roughed surfaces have been smoothened. For this purpose, an inspection unit to inspect a peripheral portion of a wafer has been developed. This inspection unit obtains an image of a peripheral portion of a polished wafer by using an imaging device such as a CCD camera and performs image processing on the image.

As described above, this inspection unit is used mainly for detecting defective portions in a peripheral portion of a wafer. The inspection results include the number and an area of the defective portions in the peripheral portion of the wafer. The conventional inspection unit cannot perform measurement of a shape of a wafer, such as a cross-sectional shape of the peripheral portion of the wafer or a radius of the wafer. Specifically, a shape of a wafer is not measured in the polishing unit, and a polishing state of the peripheral portion is not detected based on the measurement results of the wafer. Thus, operation management has not been performed in the polishing unit.

Further, the conventional inspection unit is expensive because it performs a high degree of image processing with use of an imaging device such as a CCD camera and an image processing device. Further, a long period of time is required for inspection because of image processing.

The conventional inspection unit is provided separately from the substrate processing apparatus including the polishing unit. Accordingly, in order to inspect a polished wafer, it is necessary to transfer a wafer polished in the polishing unit from the substrate processing apparatus into the inspection unit. Thus, the polishing process becomes complicated so as to lower the process efficiency. Further, if the inspection results show insufficiency of removal of defects or contaminants at the peripheral portion of the wafer in the polishing unit, it is necessary to return the wafer to the polishing unit and polish the peripheral portion of the wafer again. In such a case, the polishing process cannot be performed speedily.

SUMMARY OF THE INVENTION

The present invention has been made in view of the above drawbacks. It is, therefore, a first object of the present invention to provide a substrate processing apparatus which can polish a peripheral portion of a substrate and measure the peripheral portion of the substrate.

A second object of the present invention is to provide a substrate processing method which can polish a peripheral portion of a substrate and measure the peripheral portion of the substrate.

A third object of the present invention is to provide a substrate polishing method which can optimally polish a peripheral portion of a substrate.

A fourth object of the present invention is to provide a substrate measuring method which can readily measure a shape of a peripheral portion of a substrate with accuracy.

According to a first aspect of the present invention, there is provided a substrate processing apparatus which can polish a peripheral portion of a substrate and measure the peripheral portion of the substrate. The substrate processing apparatus includes a polishing unit for polishing a peripheral portion of a substrate, a cleaning unit for cleaning the substrate, a drying unit for drying the substrate, and a measurement unit for measuring the peripheral portion of the substrate.

With the above arrangement, a state of the peripheral portion of the substrate to be polished can be measured by the measurement unit. Thus, the state of the peripheral portion of the substrate to be polished can be obtained in the substrate processing apparatus.

The substrate processing apparatus may further include a polishing condition decision unit for determining a polishing condition of the polishing unit based on a measurement result of the peripheral portion of the substrate measured by the measurement unit. With this arrangement, the measurement results of the measurement unit can be employed directly for polishing a condition of the polishing unit. Thus, the polishing condition can quantitatively be modified based on the measurement results. Accordingly, desired polishing can be conducted on the peripheral portion of the substrate in the polishing unit.

The polishing unit may include a polishing mechanism for polishing the peripheral portion of the substrate at a desired polishing angle, and the polishing condition decision unit may be configured to determine a polishing angle at which the peripheral portion of the substrate is polished in the polishing unit, based on the measurement result of the peripheral portion of the substrate measured by the measurement unit. In this case, polishing can be conducted at optimal angles for the substrate being polished. Accordingly, the peripheral portion of the substrate can effectively be polished into a desired shape for a short term.

The measurement unit may include a diameter measurement mechanism for measuring a diameter of the substrate. In this case, the diameter of the substrate can be measured in the substrate processing apparatus. Accordingly, it is possible to facilitate polishing the peripheral portion of the substrate in the polishing unit so as to have a desired diameter. Thus, the quality of the polished substrate can be improved.

The measurement unit may include a cross-sectional shape measurement mechanism for measuring a cross-sectional shape of the peripheral portion of the substrate. In this case, the cross-sectional shape of the peripheral portion of the substrate can be measured in the substrate processing apparatus. Accordingly, it is possible to facilitate polishing the peripheral portion of the substrate in the polishing unit so as to have a desired shape. Thus, the quality of the polished substrate can be improved.

The measurement unit may include a surface condition measurement mechanism for measuring a surface condition of the peripheral portion of the substrate to detect a defective portion in the peripheral portion of the substrate. In this case, a surface condition of the peripheral portion of the substrate can be measured in the substrate processing apparatus, and a defective portion of the peripheral portion of the substrate can be detected in the substrate processing apparatus. Accordingly, it is possible to examine whether or not desired polishing is properly conducted in the polishing unit and to facilitate operation management in the polishing unit. Thus, the quality of the polished substrate can be improved.

The measurement unit may include a three-dimensional shape measurement mechanism for measuring a three-dimensional shape of the peripheral portion of the substrate.

The measurement unit may be disposed within the substrate processing apparatus. In this case, the substrate can be inspected or measured in the measurement unit without being transferred out of the substrate processing apparatus. Accordingly, the quality of the polished substrate can be improved.

According to a second aspect of the present invention, there is provided a substrate processing method which can polish a peripheral portion of a substrate and measure the peripheral portion of the substrate. A peripheral portion of a substrate is polished in a polishing unit to remove contamination and/or surface roughness of the peripheral portion of the substrate. The substrate is cleaned in a cleaning unit after the polishing. The substrate is dried in a drying unit after the cleaning. The peripheral portion of the substrate is measured in a measurement unit before the polishing and/or after the drying.

With the above method, the peripheral portion of the substrate can be measured in the substrate processing apparatus, and a state of the substrate can be obtained. Further, the measurement results of the measurement unit can be employed for the polishing condition of the polishing unit. Accordingly, it is possible to conduct desired polishing on the peripheral portion of the substrate.

According to a third aspect of the present invention, there is provided a substrate processing method which can optimally polish a peripheral portion of a substrate. A peripheral portion of a substrate is polished in a polishing unit. The peripheral portion of the substrate is measured in a measurement unit before the polishing and/or after the polishing.

With the above method, the state of the peripheral portion of the substrate can be obtained before the polishing and/or after the polishing. Further, the measurement results of the measurement unit can be employed for the polishing condition of the polishing unit. Accordingly, it is possible to conduct desired polishing on the peripheral portion of the substrate.

A polishing condition of the polishing may be determined based on a result of the measuring. In this case, polishing can be conducted under an optimal polishing condition based on the shape of the peripheral portion of the substrate to be polished. The peripheral portion of the substrate can be finished so as to have a desired shape and state. Further, even if the substrate to be polished has variations in shape, an optimal polishing condition can be determined for each substrate. Thus, the polished substrates can have the same shape. Accordingly, the quality of the polished substrate can be improved.

According to a fourth aspect of the present invention, there is provided a substrate measuring method which can readily measure a shape of a peripheral portion of a substrate with accuracy. A first thickness of a peripheral portion of a substrate is measured at a first measurement point. A second thickness of the peripheral portion of the substrate is measured at a second measurement point. A distance is measured between the first measurement point and the second measurement point. A cross-sectional shape of the peripheral portion of the substrate is calculated from the first thickness, the second thickness, and the distance between the first measurement point and the second measurement point.

With the above method, the cross-sectional shape of the peripheral portion of the substrate can be measured efficiently and accurately with a simple operation without complicated processes such as image processing.

According to a fifth aspect of the present invention, there is provided a substrate measuring method which can readily measure a shape of a peripheral portion of a substrate with accuracy. Light is applied in a form of a line to a peripheral portion of a substrate to form a linear light trace on a surface of the peripheral portion of the substrate. An image of the linear light trace is acquired by an image acquisition device that is not disposed in perpendicular or parallel to the linear light trace. Coordinates of the image of the linear light trace are calculated based on coordinates of the image acquisition device so as to produce coordinates of a cross-sectional shape of the peripheral portion of the substrate.

With the above method, the cross-sectional shape of the peripheral portion of the substrate can be measured efficiently and accurately with a simple operation without complicated processes such as image processing.

According to a sixth aspect of the present invention, there is provided a substrate measuring method which can readily measure a shape of a peripheral portion of a substrate with accuracy. A peripheral portion of a first substrate and a peripheral portion of a second substrate are polished in parallel in a first polishing unit and a second polishing unit, respectively, to remove contamination and/or surface roughness of the peripheral portions of the first substrate and the second substrate. The first substrate and the second substrate are cleaned in a cleaning unit after the polishing. The first substrate and the second substrate are dried in a drying unit after the cleaning. The peripheral portion of the substrate is measured in a measurement unit before the polishing and/or after the drying.

With the above method, separate substrates are polished in parallel in the respective polishing units to remove contamination and/or surface roughness of the peripheral portions of the first substrate and the second substrate. Thus, a plurality of substrates are simultaneously polished so as to increase the number of substrates processed per unit time in the substrate processing apparatus. Accordingly, it is possible to improve a throughput of the substrate processing apparatus. Further, since the peripheral portion of the substrate is measured in a measurement unit before the polishing and/or after the drying, a state of the peripheral portion of the substrate can be obtained. The measurement results can be employed for the polishing condition of the polishing unit. Accordingly, it is possible to conduct desired polishing on the peripheral portion of the substrate.

According to a seventh aspect of the present invention, there is provided a substrate measuring method which can readily measure a shape of a peripheral portion of a substrate with accuracy. A peripheral portion of a substrate is polished in a first polishing unit to remove contamination and/or surface roughness of the peripheral portion of the substrate. The peripheral portion of the substrate is polished in a second polishing unit to remove contamination and/or surface roughness of the peripheral portion of the substrate after the polishing in the first polishing unit. The substrate is cleaned in a cleaning unit after the polishing. The substrate is dried in a drying unit after the cleaning. The peripheral portion of the substrate is measured in a measurement unit before the polishing and/or after the drying.

With the above method, the same substrate is subsequently polished in the respective polishing units to remove contamination and/or surface roughness of the peripheral portion of the substrate. Accordingly, the respective polishing units can perform different polishing processes, e.g., rough polishing and finish polishing. Thus, the polishing units can be used for the respective purposes. Therefore, the substrate can effectively be finished into a desired shape. Further, since the peripheral portion of the substrate is measured in a measurement unit before the polishing and/or after the drying, a state of the peripheral portion of the substrate can be obtained. The measurement results can be employed for the polishing condition of the polishing unit. Accordingly, it is possible to conduct desired polishing on the peripheral portion of the substrate.

The above and other objects, features, and advantages of the present invention will be apparent from the following description when taken in conjunction with the accompanying drawings which illustrate preferred embodiments of the present invention by way of example.

BRIEF DESCRIPTION OF DRAWINGS

FIG. 4A is a perspective view schematically showing a substrate holding and rotating mechanism of a measurement unit in the substrate processing apparatus shown in FIG. 2;

FIG. 4B is a schematic plan view of the substrate holding and rotating mechanism shown in FIG. 4A;

FIG. 11A is a cross-sectional view of a peripheral portion of a measured straight-type wafer and a graph of measured data;

FIG. 11B is a cross-sectional view of a peripheral portion of a measured round-type wafer and a graph of measured data;

FIG. 12 is a perspective view schematically showing a measurement unit according to a third embodiment of the present invention;

FIG. 13 is a schematic view showing an example of an image obtained by a CCD camera to pick up light emitted from a light-emitting device in the measurement unit shown in FIG. 12;

FIG. 14 is a perspective view schematically showing a measurement unit according to a fourth embodiment of the present invention;

FIG. 15A is a schematic plan view showing an installed position of a CCD camera in the measurement unit shown in FIG. 14;

FIG. 15B is a schematic side view of FIG. 15A;

FIG. 15C is a schematic view explanatory of converting a trace on a photographed image into a trace for calculation;

FIG. 16A is a schematic plan view showing a measurement unit according to a fifth embodiment of the present invention;

FIG. 16B is a schematic side view of FIG. 16A;

FIG. 19 is a perspective view showing an example in which the measurement unit is installed in the substrate processing apparatus;

FIG. 22 is a perspective view schematically showing a primary cleaning unit in the substrate processing apparatus shown in FIG. 2;

FIG. 23 is a perspective view schematically showing a spin-dry unit having a cleaning function in the substrate processing apparatus shown in FIG. 2;

FIG. 24 is a plan view explanatory of routes of wafers in first and second process patterns;

FIG. 25 is a plan view explanatory of a route of a wafer in a third process pattern;

FIG. 26 is a diagram explanatory of routes of wafers in fourth to seventh process patterns; and FIG. 27 is a cross-sectional view explanatory of processes of determining polishing conditions for a peripheral portion of a wafer to be polished.

DETAILED DESCRIPTION OF THE INVENTION

Figure 1A:
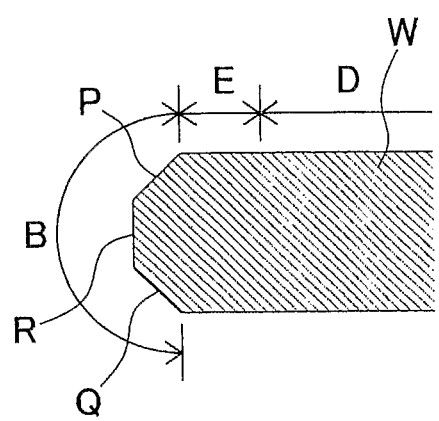
FIG. 1A is a cross-sectional view showing a peripheral portion of a straight-type wafer.
Figure 1B:
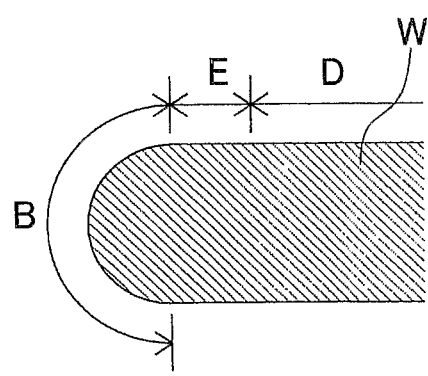
FIG. 1B is a cross-sectional view showing a peripheral portion of a round-type wafer.

A substrate processing apparatus according to embodiments of the present invention will be described below with reference to FIGS. 2 through 27. Like or corresponding parts are denoted by like or corresponding reference numerals throughout drawings and will not be described below repetitively.

Figure 2:
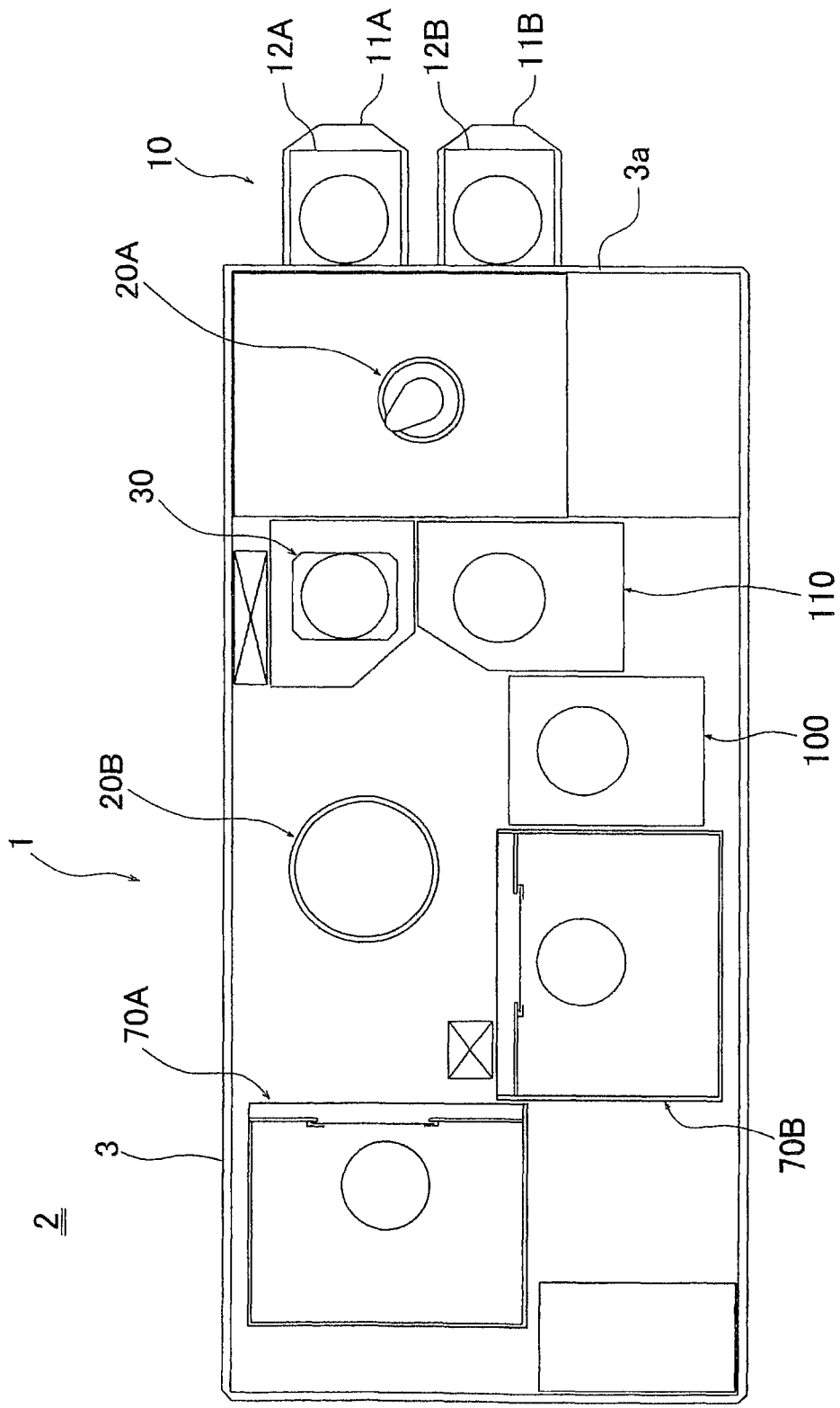
FIG. 2 is a schematic plan view showing a substrate processing apparatus according to an embodiment of the present invention.
Figure 3:
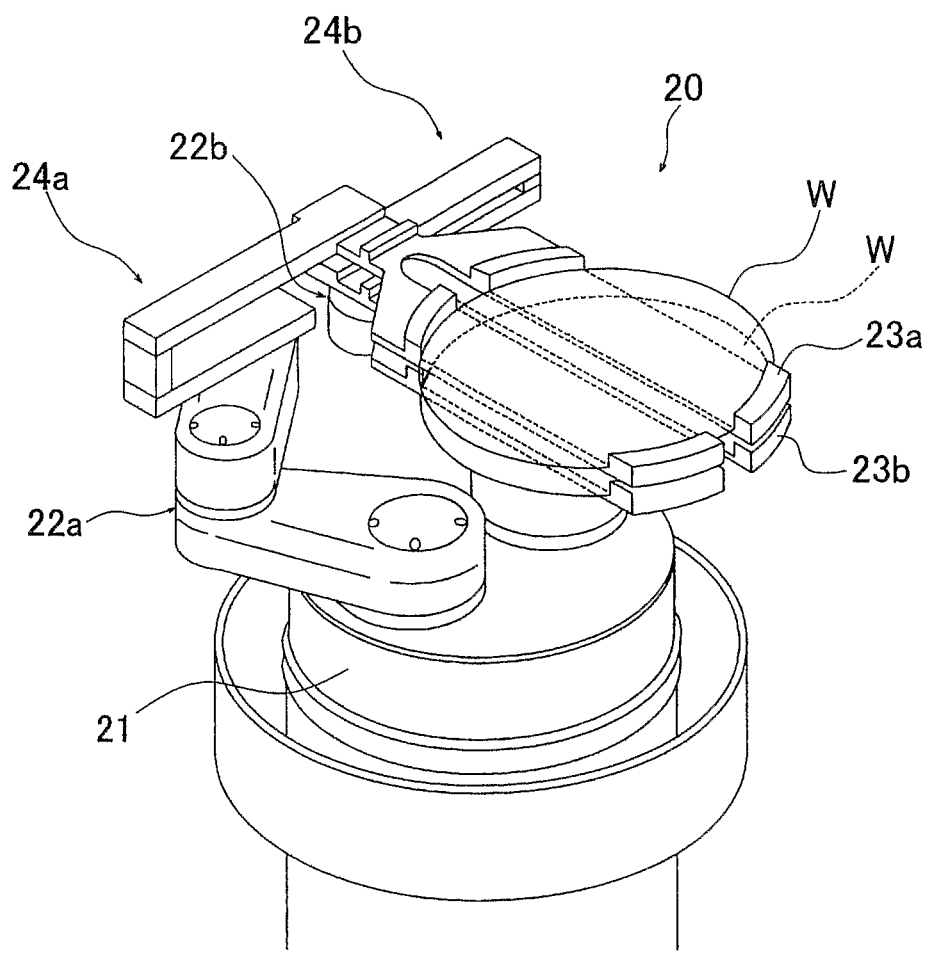
FIG. 3 is a perspective view showing an example of a transfer robot in the substrate processing apparatus shown in FIG. 2.

FIG. 2 is a schematic plan view showing an entire arrangement of a substrate processing apparatus 1 according to an embodiment of the present invention. As shown in FIG. 2, the substrate processing apparatus 1 includes a loading/unloading port 10 having wafer supply/recovery devices 11A and 11B disposed thereon, a measurement unit 30 for measuring a shape of a peripheral portion of a wafer or the like, a first transfer robot 20A for transferring a wafer mainly between the loading/unloading port 10, the measurement unit 30, and a secondary cleaning and drying unit 110, a first polishing unit 70A for polishing a peripheral portion of a wafer, and a second polishing unit 70B for polishing a peripheral portion of a wafer. The substrate processing apparatus 1 also includes a primary cleaning unit 100 for conducting primary cleaning of a polished wafer, a secondary cleaning and drying unit 110 for conducting secondary cleaning and drying on the wafer that has been subjected to the primary cleaning, and a second transfer robot 20B for transferring a wafer mainly between the first polishing unit 70A, the second polishing unit 70B, the primary cleaning unit 100, and the secondary cleaning and drying unit 110. Further, the substrate processing apparatus 1 has a polishing condition decision unit (not shown) for determining polishing conditions in the polishing units 70A and 70B based on the measurement results of the wafer by the measurement unit 30. Specifically, the polishing condition decision unit forms a portion of a controller and calculates polishing conditions based on the measurement results of a peripheral portion of a wafer. In the specification, the term "unit" is used to describe an assembly (module) of a process device disposed in the substrate processing apparatus 1.

Arrangements and operations of the units in the substrate processing apparatus 1 will be described in greater detail.

The units of the substrate processing apparatus 1 are housed in a housing 3 disposed in a clean room 2. An inner space of the substrate processing apparatus 1 is partitioned from an inner space of the clean room 2 by walls of the housing 3. Clean air is introduced into the housing 3 through a filter (not shown) provided at an upper portion of the housing 3. Inside air is discharged to the exterior of the substrate processing apparatus 1 through a discharge section (not shown) provided at a lower portion of the housing 3. Thus, a downflow of clean air is formed in the housing 3. In this manner, air flow is optimized in the substrate processing apparatus 1 for processing substrates. The units disposed within the housing 3 are housed in chambers, respectively. Further, air flow is optimized in each chamber for processing substrates.

The loading/unloading port 10 is provided outside of a sidewall 3a near the first transfer robot 20A. Two wafer supply/recovery devices 11A and 11B are placed in parallel on the loading/unloading port 10. For example, each of the wafer supply/recovery devices 11A and 11B comprises a front opening unified pod (FOUP) for supplying wafers to and recovering wafers from the substrate processing apparatus. When a wafer cassette (wafer carrier) 12A or 12B housing a plurality of wafers is mounted on either the wafer supply/recovery device 11A or 11B, a cover of the wafer cassette 12A or 12B is automatically opened while a shutter (not shown) provided at the sidewall 3a is opened. Then, the first transfer robot 20A removes one of the wafers from the wafer cassette 12A or 12B into the substrate processing apparatus 1.

Since the two wafer supply/recovery devices 11A and 11B are disposed in parallel on the loading/unloading port 10, wafers can be transferred in parallel from and to the two wafer supply/recovery devices 11A and 11B. Thus, an operating rate of the substrate processing apparatus 1 can be improved. Specifically, an unprocessed wafer is transferred from a first wafer cassette 12A or 12B on one of the wafer supply/recovery devices 11A and 11B, and then another unprocessed wafer is transferred from a second wafer cassette 12A or 12B on the other of the wafer supply/recovery devices 11A and 11B. At that time, the first wafer cassette 12A or 12B, which has recovered a processed wafer subjected to predetermined processes in the substrate processing apparatus 1, is replaced with another wafer cassette. Thus, unprocessed wafers can continuously be transferred into the substrate processing apparatus 1.

Structures of the first and second transfer robots 20A and 20B will be described below. The first and second transfer robots 20A and 20B have the common structure shown as a transfer robot 20 in FIG. 3. The transfer robot 20 has a double-hand structure including two handling mechanisms 24a and 24b. The handling mechanisms 24a and 24b have the same arrangement. The double-hand structure is provided on an upper surface of a rotatable base 21. The handling mechanisms 24a and 24b have slide arm mechanisms 22a and 22b and hands 23a and 23b attached to ends of the slide arm mechanisms 22a and 22b for holding a wafer W. The hands 23a and 23b are vertically spaced at a predetermined interval. Rotation of the base 21 and slide of the arm mechanisms 22a and 22b move the hands 23a and 23b to desired positions, respectively, to thereby transfer the wafer W to predetermined locations. The upper hand 23a is used as a dry hand for transferring a dry wafer W before or after processing. The lower hand 23a is used as a wet hand for transferring a wet wafer W discharged from the first and second polishing units 70A and 70B and the primary cleaning unit 100 during processing. Thus, since the hands 23a and 23b are used for separate purposes, clean wafers W before or after processing are prevented from being contaminated. The transfer robot 20 may have a single-hand structure having a single handling mechanism.

An arrangement of the measurement unit 30 will be described below. The measurement unit 30 has a substrate holding and rotating mechanism 61 shown in FIGS. 4A and 4B. FIG. 4A is a schematic perspective view of the substrate holding and rotating mechanism 61, and FIG. 4B is a schematic plan view of the substrate holding and rotating mechanism 61. The substrate holding and rotating mechanism 61 serves to hold and rotate a wafer W at the time of measurement in the measurement unit 30. As shown in FIGS. 4A and 4B, the substrate holding and rotating mechanism 61 has a two-stage structure. The two-stage structure includes an upper chuck (upper spin chuck) 62 having a plurality of stages 62a for clamping an outer circumferential portion of the wafer W and a lower chuck (lower spin chuck) 63 having a plurality of stages 63a for clamping an outer circumferential portion of the wafer W. The upper chuck 62 and the lower chuck 63 are arranged coaxially and rotated about a rotational shaft 64. Each of the upper and lower chucks 62 and 63 has four stages 62a and 63a arranged at predetermined intervals. As shown in FIG. 4B, the stages 62a and 63a of the upper and lower chucks 62 and 63 are shifted at predetermined angles so that the stages 62a and 63a are not aligned with each other in the vertical direction. Further, the lower chuck 63 is vertically movable with respect to the upper chuck 62. The substrate holding and rotating mechanism 61 also has a rotation drive mechanism (not shown) for rotating the upper chuck 62 and the lower chuck 63 and an index mechanism (not shown) for indexing rotation and angles of the upper chuck 62 and the lower chuck 63 at constant speeds.

Figure 5A:
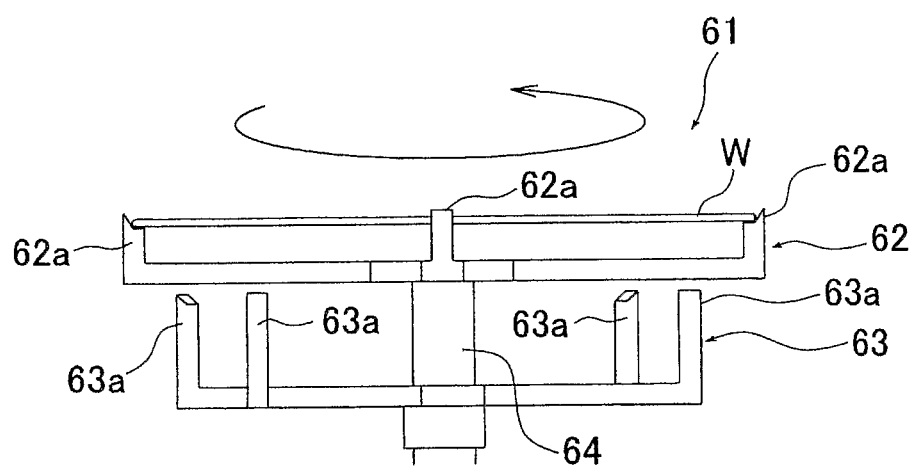
FIG. 5A is a schematic view showing the substrate holding and rotating mechanism which holds a wafer by an upper chuck.
Figure 5B:
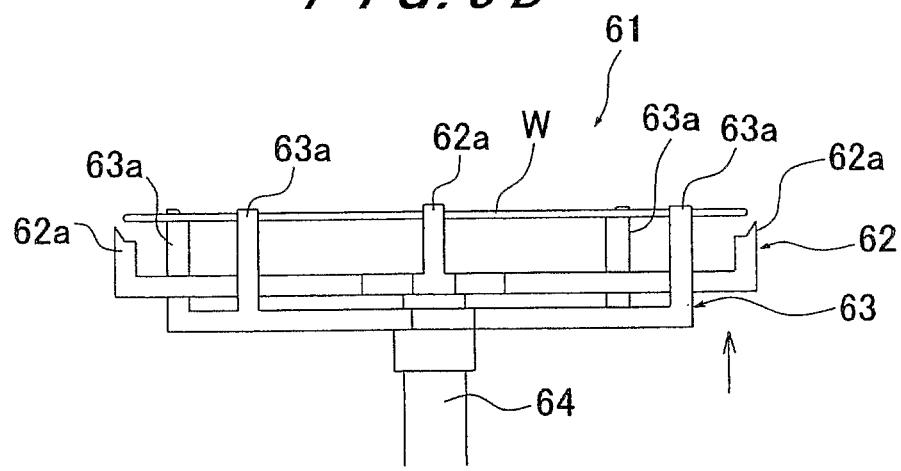
FIG. 5B is a schematic view showing the substrate holding and rotating mechanism which holds a wafer by a lower chuck.

Operation of the substrate holding and rotating mechanism 61 will be described below with reference to FIGS. 5A and 5B. Usually, as shown in FIG. 5A, a wafer W is measured while the upper chuck 62 holds the wafer W. Before the stages 62a are positioned into a peripheral portion of the wafer W to be measured by rotation of the upper chuck 62, the lower chuck 63 is lifted as shown in FIG. 5B to hold the wafer W. Accordingly, the wafer W is disengaged with the stages 62a of the upper chuck 62. At that state, when the upper chuck 62 and the lower chuck 63 are rotated through predetermined angles, the stages 62a of the upper chuck 62 are prevented from being positioned into the measurement portion of the wafer W. After the stages 62a of the upper chuck 62 pass through the measurement portion of the wafer W, the lower chuck 63 is lowered. Then, the wafer W is held by the upper chuck 62. Such operation prevents the stages 62a of the upper chuck 62 from being positioned into the measurement portion of the wafer W. Accordingly, it is possible to measure the overall peripheral portion of the wafer W. This substrate holding and rotating mechanism 61 is provided in each example of the measurement units which will be described below.

Figure 6:
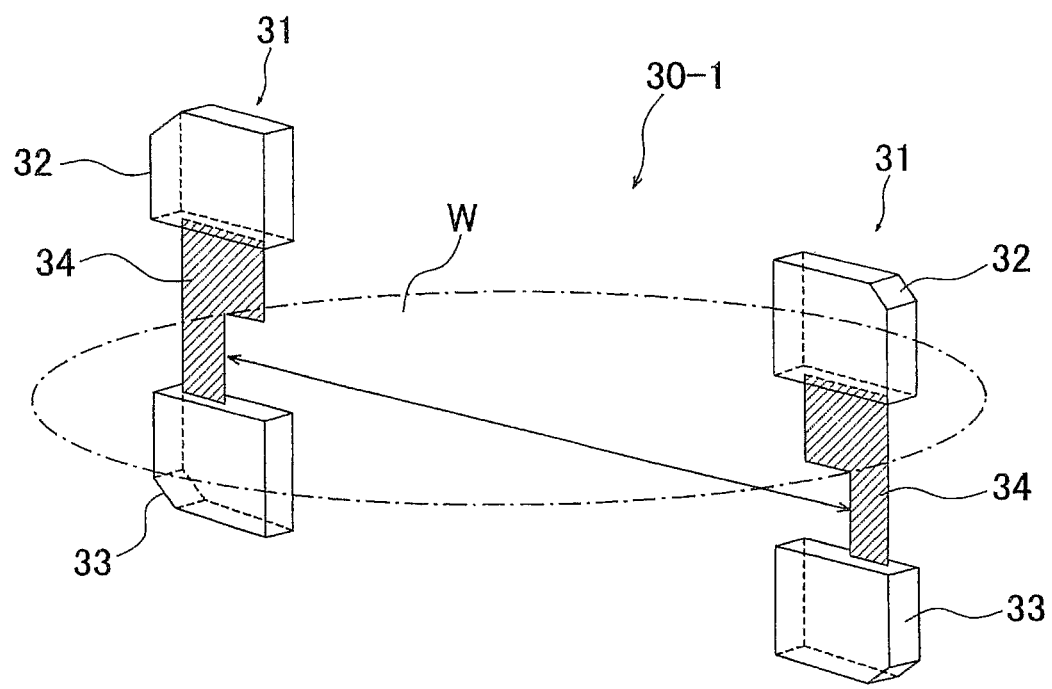
FIG. 6 is a perspective view schematically showing a measurement unit according to a first embodiment of the measurement unit in the substrate processing apparatus shown in FIG. 2.
Figure 7A:
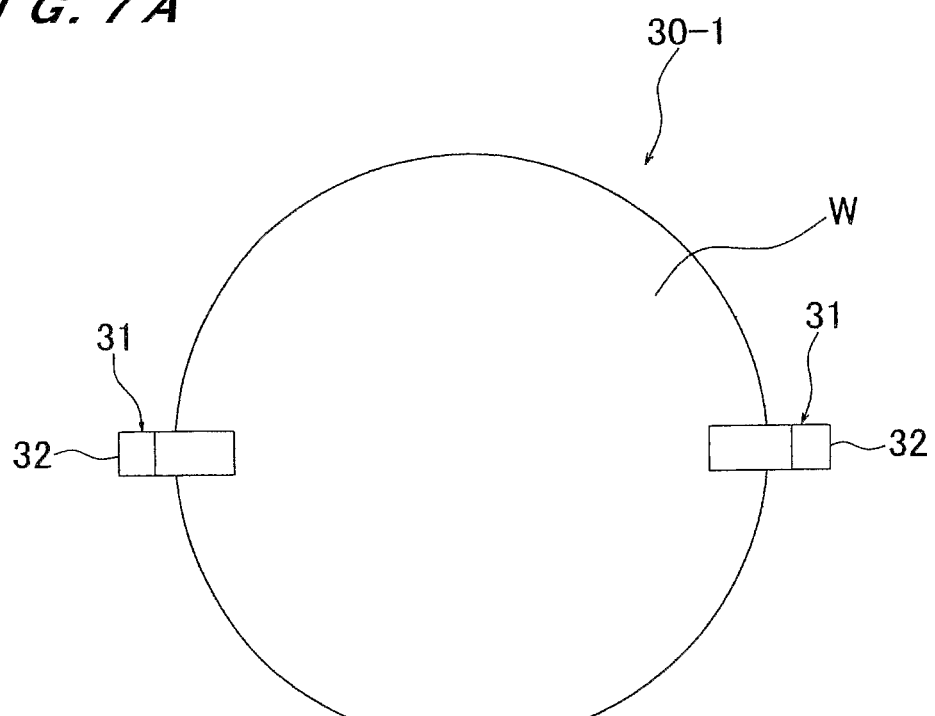
FIG. 7A is a schematic plan view of the measurement unit shown in FIG. 6.
Figure 7B:
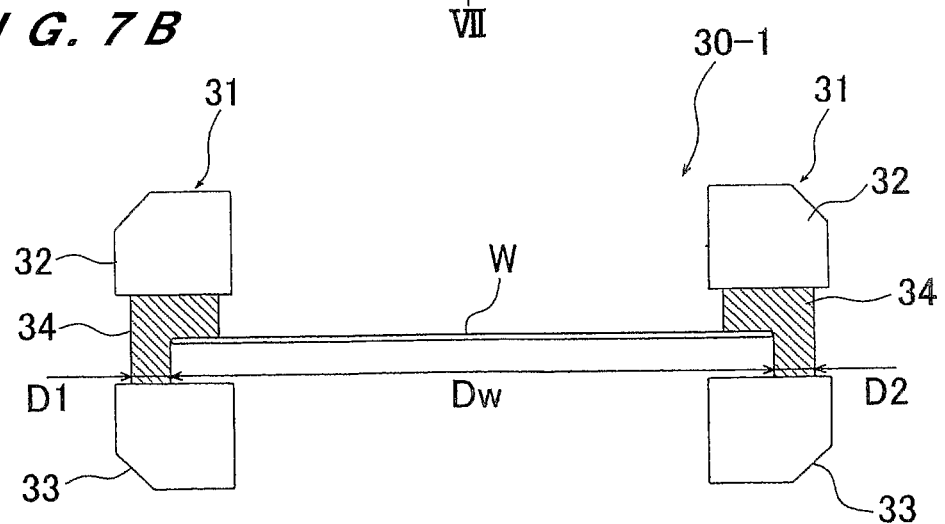
FIG. 7B is a side view of FIG. 7A.

A first embodiment of the measurement unit will be described. FIG. 6 is a perspective view schematically showing a measurement unit 30-1 according to the first embodiment. FIG. 7A is a schematic plan view of the measurement unit 30-1, and FIG. 7B is a view as seen in a direction VII of FIG. 7A. In FIGS. 6, 7A, and 7B, the substrate holding and rotating mechanism 61 is not illustrated for brevity. Similarly, in other drawings for measurement units, the substrate holding and rotating mechanism 61 is not illustrated for brevity. The measurement unit 30-1 has a diameter measurement mechanism for measuring an outside diameter of a wafer W to detect the polishing amount of a side surface (of a bevel portion) of the wafer W. The measurement unit 30-1 includes a substrate holding and rotating mechanism 61 and sensor mechanisms (laser sensors) 31. The sensor mechanisms have two pairs of a light-emitting device 32 and a light-receiving device 33 vertically spaced near a peripheral portion of the wafer W held by the substrate holding and rotating mechanism 61. Each of the light-emitting devices 32 emits laser light.

In the present embodiment, two sensor mechanisms 31 and 31 are provided in the measurement unit 30-1. The two sensor mechanisms 31 and 31 are located across a center line of the wafer W held by the substrate holding and rotating mechanism 61. The sensor mechanisms 31 and 31 are connected to a data processing device (not shown) for digitalizing quantity of laser light received by the light-receiving devices 33. The light-receiving devices 33 may be disposed above the wafer W, and the light-emitting devices 32 may be disposed below the wafer W.

As shown in FIG. 7B, each of the sensor mechanisms 31 emits laser light 34 downward from the light-emitting device 32 to the peripheral portion of the wafer W. The emitted laser light 34 is in the form of a line or a surface and has a predetermined width. The emitted laser light 34 intersects the peripheral portion of the wafer W in the radial direction of the wafer W. Accordingly, a portion of the laser light 34 is blocked by the peripheral portion of the wafer W. Thus, only laser light 34 that has not been blocked by the wafer W and has passed outside of the wafer W is received by the light-receiving device 33. The quantity of received light is converted into numbers by the data processing device to calculate a width of the laser light 34 that has passed outside of the outer circumferential portion of the wafer W, i.e., each dimension D1, D2 shown in FIG. 7B. In order to calculate a diameter of the wafer, a reference wafer (not shown) having a known diameter is prepared and measured by the measurement unit 30-1 to obtain dimensions D1 and D2. Then, a diameter Dw of a wafer W to be measured can be calculated from differences between the dimensions D1, D2 of the reference wafer and the dimensions D1, D2 of the wafer to be measured and the diameter of the reference wafer.

Further, rotational angles of the upper chuck 62 and the lower chuck 63 in the substrate holding and rotating mechanism 61 are indexed to measure the diameter at a plurality of points on the peripheral portion of the wafer W. In this manner, it is possible to obtain information that cannot be obtained from one point measurement, such as variations of the polishing amount over the entire peripheral portion of the wafer W. Furthermore, the diameter of the wafer can continuously be measured while the wafer is rotated by the substrate holding and rotating mechanism 61. According to this method, the diameter of the wafer can be obtained as continuous data. Thus, it is possible to calculate the circularity of the wafer.

Figure 8:
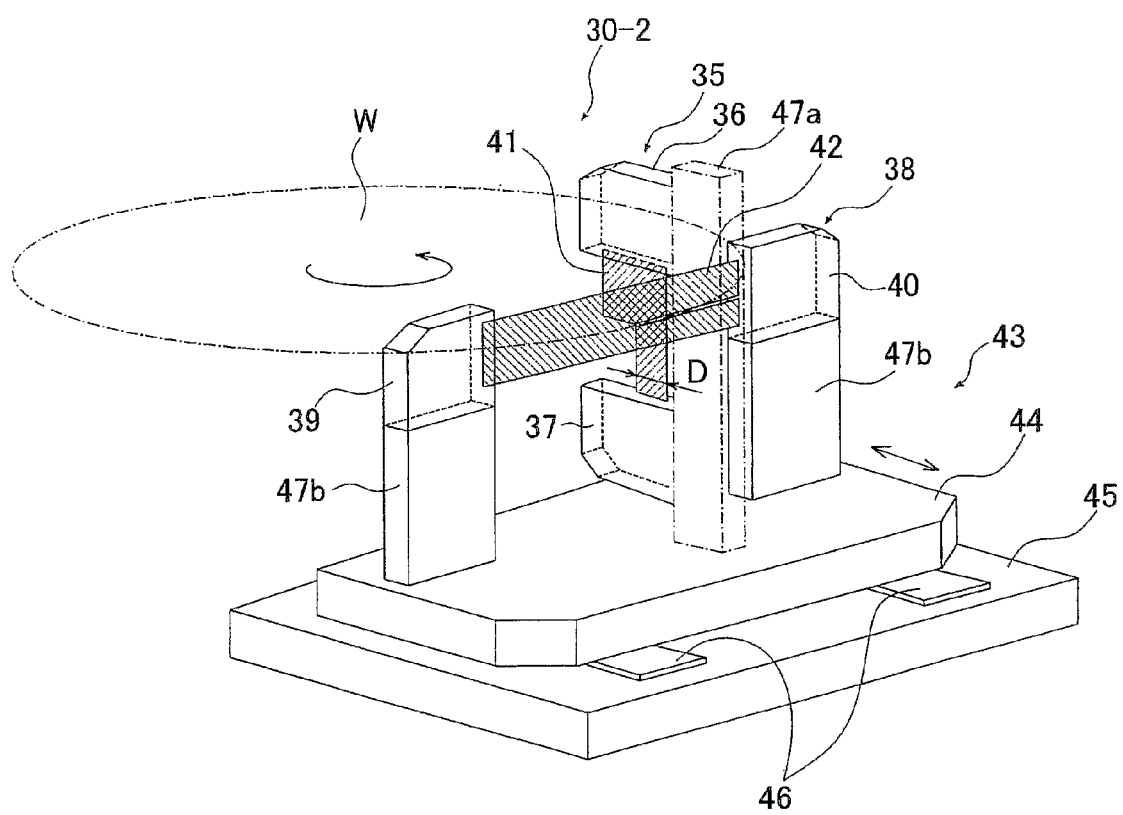
FIG. 8 is a perspective view schematically showing a measurement unit according to a second embodiment of the present invention.

A second embodiment of the measurement unit will be described. FIG. 8 is a perspective view schematically showing a measurement unit 30-2 according to the second embodiment. The measurement unit 30-2 shown in FIG. 8 has a cross-sectional shape measurement mechanism for measuring a cross-sectional shape of a peripheral portion of a wafer W (cross-sectional shape along a radial direction of a wafer W). Thus, the measurement unit 30-2 can determine the polishing amount of a bevel portion including an upper inclined portion P, a lower inclined portion Q, and a side surface R (see FIG. 1A) in the polishing units 70A and 70B and variations in shape or dimension of the peripheral portion of the wafer W before and after polishing, based on the measured cross-sectional shape of the peripheral portion.

The measurement unit 30-2 has a substrate holding and rotating mechanism 61, a first sensor mechanism (first laser sensor) 35, and a second sensor mechanism (second laser sensor) 38. The first sensor mechanism includes a pair of a light-emitting device 36 and a light-receiving device 37. The light-emitting device 36 is disposed above a peripheral portion of the wafer W held by the substrate holding and rotating mechanism 61. The light-receiving device 37 is disposed below the peripheral portion of the wafer W. The second sensor mechanism 38 includes a pair of a light-emitting device 39 and a light-receiving device 40 arranged in a tangential direction of a side surface of the wafer W so as to interpose a peripheral portion of the wafer W therebetween. The first sensor mechanism 35 has the same structure and functions as the sensor mechanism 31 shown in FIG. 6. The first sensor mechanism 35 measures a width of laser light 41 that has been emitted from the light-emitting device 36 and has passed through the outer circumferential portion of the wafer W. In the second sensor mechanism 38, laser light 42 is emitted from the light-emitting device 39 in parallel to a surface that is parallel to upper and lower surfaces of the wafer, which is hereinafter referred to as a wafer surface, and applied laterally to the peripheral portion of the wafer W. A portion of the laser light 42 is blocked by the peripheral portion of the wafer W. The second sensor mechanism 38 measures a thickness of a cross-section at the peripheral portion of the wafer W.

Figure 9:
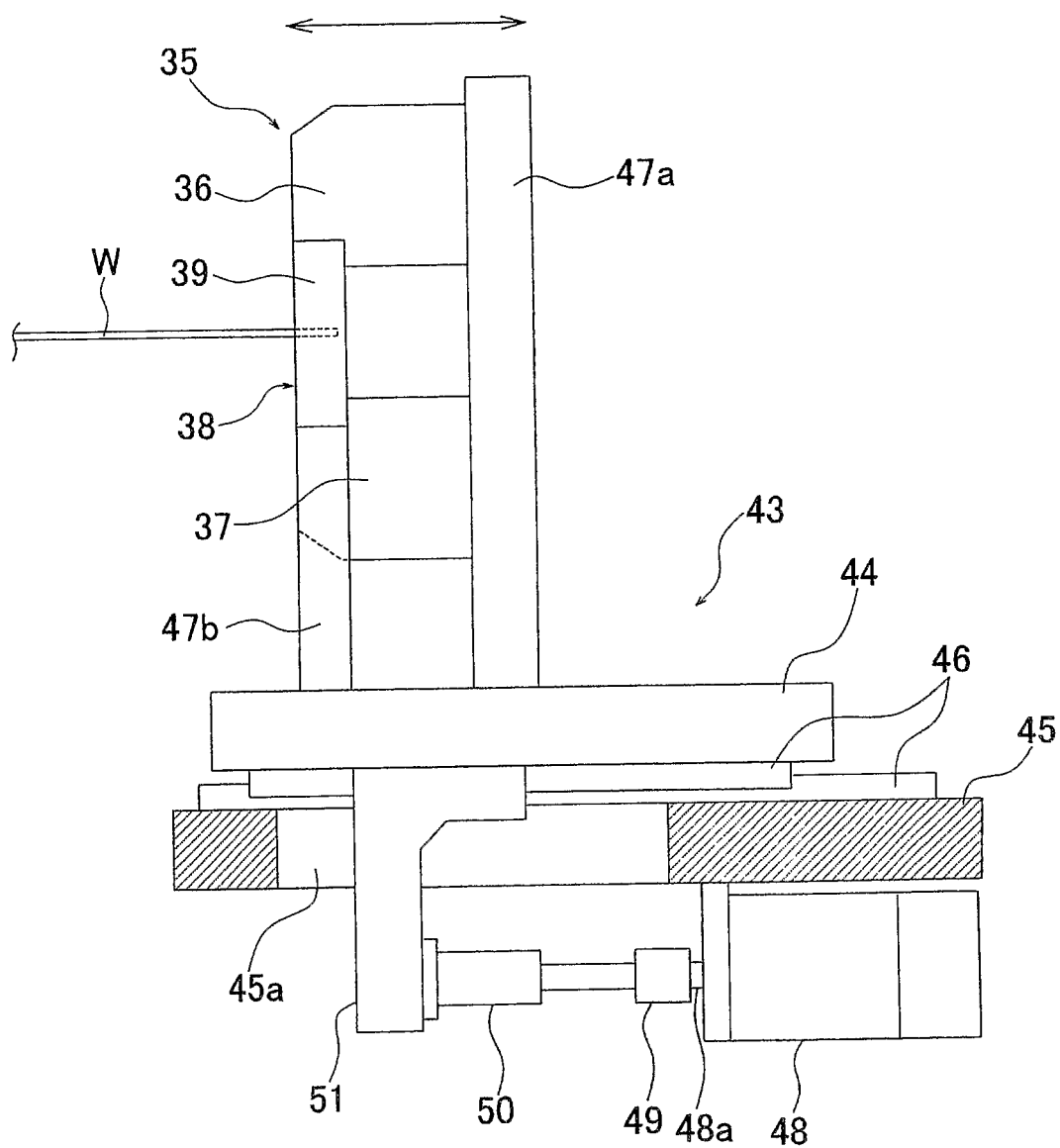
FIG. 9 is a schematic side view showing a movement mechanism in the measurement unit shown in FIG. 8.

The first and second sensor mechanisms 35 and 38 are mounted to a movement mechanism 43, which moves and slides the sensor mechanisms 35 and 38 in a direction toward the center of the wafer W held by the substrate holding and rotating mechanism 61. FIG. 9 is a schematic side view showing the first and second sensor mechanisms 35 and 38 mounted to the movement mechanism 43. FIG. 9 partially includes a cross-sectional view. As shown in FIGS. 8 and 9, the movement mechanism 43 includes a movable plate 44 having an upper surface to which the first and second sensor mechanisms 35 and 38 are mounted, a fixed plate 45, and linear guides 46 attached to an upper surface of the fixed plate 45 for slidably supporting the movable plate 44. The first sensor mechanism 35 is attached to a side surface of a pillar 47a, which is fixed to the movable plate 44. The second sensor mechanism 38 is attached to support bases 47b, which are fixed to the movable plate 44. The light-emitting devices 36, 39 and the light-receiving devices 37, 40 in the first and second sensor mechanisms 35 and 38 are accurately positioned to measure the peripheral portions of the wafer W. Thus, the first and second sensor mechanisms 35 and 38 are configured to accurately apply the laser lights 41 and 42 to the measurement portions of the wafer W, respectively.

The linear guides 46 are arranged such that the movable plate 44 is linearly moved close to or away from the wafer W. As shown in FIG. 9, a servomotor 48 is fixedly attached to a lower surface of the fixed plate 45. The servomotor 48 has a rotational shaft 48a connected to a ball screw 50 via a coupling 49. Further, a connection plate 51 is fixed to a lower surface of the movable plate 44. The connection plate 51 extends through a through hole 45a formed in the fixed plate 45 and projects downward from the fixed plate 45. The ball screw 50 is fixedly connected to the connection plate 51. Accordingly, when the servomotor 48 is driven to rotate through a predetermined angle, the rotation is converted into a linear movement of the connection plate 51 via the ball screw 50. Thus, the movable plate 44 is linearly moved along the linear guides 46 by a predetermined distance.

Figure 10A:
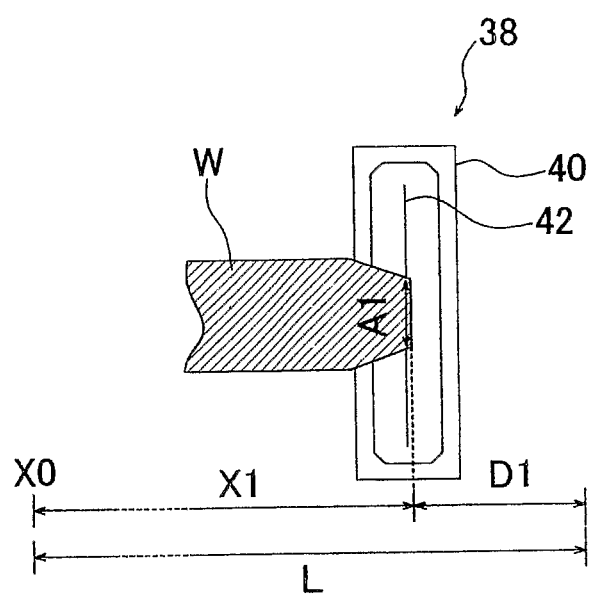
FIGS. 10A and 10B are views of a light-receiving device of a second sensor mechanism in the movement mechanism shown in FIG. 9.
Figure 10B:
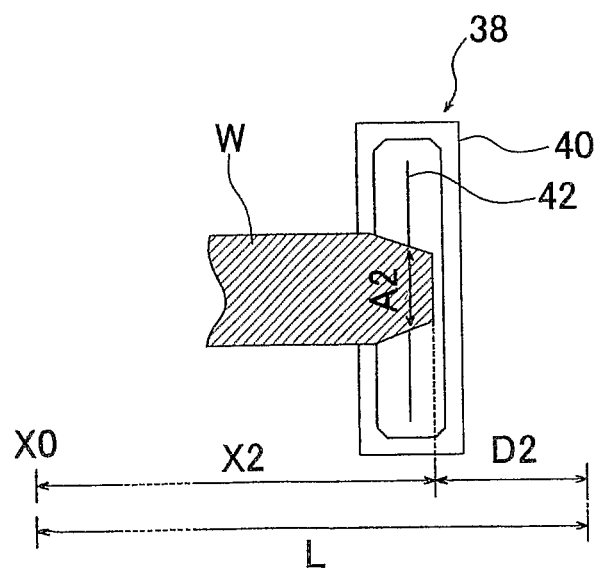

Shape measurement of peripheral portions of a wafer W is performed in the measurement unit 30-2 as follows. FIGS. 10A and 10B are views of the light-receiving device 40 as seen from the light-emitting device 39 of the second sensor mechanism 38. FIGS. 10A and 10B show that laser light 42 emitted from the light-emitting device 39 is blocked by a peripheral portion of the wafer W and that a portion of the laser light 42 is received by the light-receiving device 40. First, the first and second sensor mechanisms 35 and 38 are positioned to predetermined locations. As shown in FIG. 10A, the second sensor mechanism 38 measures a width A1 of a side surface (in cross-section) of the wafer W (a thickness of the peripheral portion), which blocks the laser light 42. Further, the first sensor mechanism 35 measures a width D1 of laser light 41 that has been emitted from the light-emitting device 36 and is received by the light-receiving device 37. The width D1 is used to calculate a distance X1 from a reference point X0, which is positioned radially inward from the first and second sensor mechanisms 35 and 38 by a predetermined distance L, to an outer circumferential surface of the wafer W. Thus, relative positions of the first and second sensor mechanisms 35 and 38 to the wafer W are calculated.

Then, the movement mechanism 43 slightly moves the first and second sensor mechanisms 35 and 38 toward the center of the wafer W. At that state, as shown in FIG. 10B, a thickness A2 of a peripheral portion of the wafer W and a distance X2 from the reference point X0 to the outer circumferential surface of the wafer W are measured in the same manner as described above. Thereafter, the movement mechanism 43 gradually moves the first and second sensor mechanisms 35 and 38 toward the center of the wafer W by slight distances to measure thicknesses An of a plurality of points on the peripheral portion of the wafer W and distances Xn from the reference point to the outer circumferential surface of the wafer W. In this manner, it is possible to obtain a radial thickness distribution of the peripheral portion of the wafer W.

FIGS. 11A and 11B are cross-sectional views of a peripheral portion of a measured wafer and graphs of measured data. FIG. 11A shows a case of a straight-type wafer W, and FIG. 11B shows a case of a round-type wafer W. In the graphs of FIGS. 11A and 11B, the horizontal axis represents a position Xn of measurement points of the wafer W (a relative position between the wafer W and the first and second sensor mechanisms 35 and 38), whereas the vertical axis represents a thickness An (½An) of the wafer W at the measurement points. Measured values are plotted in the graphs of FIGS. 11A and 11B. As shown in FIGS. 11A and 11B, the plotted points are interconnected by estimation lines. Each estimation line schematically shows an actual cross-sectional shape of the wafer W. Since the cross-sectional shape is measured by measurement of the thickness of the peripheral portion of the wafer W, the peripheral portion of the measured wafer W should have a symmetrical shape in a thickness direction of the wafer W. Generally, a peripheral portion of a wafer has a symmetrical shape in a thickness direction with respect to a central plane of the wafer. Accordingly, a cross-sectional shape of a peripheral portion of a wafer can be represented by plotting measured values of the thickness of the peripheral portion. Further, measurement may be performed while the first and second sensor mechanisms 35 and 38 are moved toward the center of the wafer W at a low rate. In such a case, the thicknesses An of a plurality of points on the peripheral portion of the wafer W and distances Xn from the reference point and the outer circumferential surface of the wafer W can be obtained as continuous data to extract a cross-sectional shape of the peripheral portion of the wafer W.

In the movement mechanism 43 of the measurement unit 30-2, the servomotor 48 may comprise a servomotor having a high resolution, and the ball screw 50 of may comprise a precision ball screw having extremely small backlash. In such a case, a rotational angle of the servomotor 48 can be converted into positions so as to calculate relative positions between the first and second sensor mechanisms 35, 38, and the wafer W. Thus, a cross-sectional shape of the peripheral portion of the wafer W can be measured without measurement by the first sensor mechanism 35 as described above. Accordingly, the first sensor mechanism 35 may be eliminated in such a case.

In the present embodiment, the first and second sensor mechanisms 35 and 38 are moved toward the center of the wafer W. However, a movement mechanism (not shown) may be provided for moving the substrate holding and rotating mechanism 61 toward the first and second sensor mechanisms 35 and 38 which are fixed. In such a case, the wafer W can be measured while it is moved toward the first and second sensor mechanisms 35 and 38.

A third embodiment of the measurement unit will be described. FIG. 12 is a perspective view schematically showing a measurement unit 30-3 according to the third embodiment. The measurement unit 30-3 shown in FIG. 12 has a cross-sectional shape measurement mechanism for measuring a cross-sectional shape of a peripheral portion of the wafer W. Specifically, the measurement unit 30-3 includes a substrate holding and rotating mechanism 61, a light-emitting device 52 for emitting light in a tangential direction of a side surface of the wafer W toward a predetermined location of the peripheral portion of the wafer W held by the substrate holding and rotating mechanism 61, and a CCD camera 53 as an image acquisition device disposed on an opposite side of the peripheral portion of the wafer to the light-emitting device 52. The light-emitting device 52 emits light 54, which can be picked up by the CCD camera 53. Examples of the light 54 include LED light and an infrared ray. The CCD camera 53 is connected to an image processing device (not shown). The measurement unit 30-3 employs the fact that a portion of light 54 emitted from the light-emitting device 52 is blocked by the side surface of the peripheral portion of the wafer W. The light 54 partially blocked is acquired as image information to measure a cross-sectional shape of the peripheral portion of the wafer W.

FIG. 13 shows an example of an image obtained by the CCD camera 53 to pick up light 54 emitted from the light-emitting device 52. As shown in FIG. 13, a cross-sectional shape S of the peripheral portion of the wafer W is projected onto the emitted light 54. Edge extraction is performed with the image photographing of the light 54 in the image processing device. Then, a boundary line U between the background of the light 54 and the projection S of the cross-section of the peripheral portion of the wafer W is obtained as coordinate data and then digitalized. The digitalized data can be processed to measure a length L1 of a side surface R, an inclination angle $\phi$ of an upper inclined portion P with respect to a wafer surface, a horizontal distance L2 of the upper inclined portion P and a lower inclined portion Q, a curvature $\rho 1$ at a boundary between the upper inclined portion P and the side surface R, and a curvature $\rho 2$ at a boundary between the lower inclined portion Q and the side surface R in the cross-section S of the peripheral portion of the wafer W.

Although the image photographed by the CCD camera 53 is two-dimensional, if edge extraction of the photographed image is performed, it is possible to process only data digitalized in the edge extraction. Accordingly, only digitalized data can be used without complicated image processing, and the devices can have simple structures. Further, it is not necessary to store data of the photographed image itself or to provide a mass-storage device for storing image data. Usually, an image is photographed at one point on the peripheral portion of the wafer W. However, images can be photographed at a plurality of points on the peripheral portion while the wafer W is rotated by the substrate holding and rotating mechanism 61 as needed. By such measurement at a plurality of points, it is possible to determine whether or not the wafer W is polished uniformly over the overall peripheral portion.

A fourth embodiment of the measurement unit will be described. FIG. 14 is a perspective view schematically showing a measurement unit 30-4 according to the fourth embodiment. The measurement unit 30-4 shown in FIG. 14 has a cross-sectional shape measurement mechanism for measuring a cross-sectional shape of a peripheral portion of the wafer W. Specifically, the measurement unit 30-4 includes a substrate holding and rotating mechanism 61, a light-emitting device (laser light-emitting device) 55 disposed above a predetermined location of the peripheral portion of the wafer W held by the substrate holding and rotating mechanism 61, and a CCD camera 56 as an image acquisition device disposed above the peripheral portion of the wafer W. The CCD camera 56 and the light-emitting device 55 are connected to an image processing device (not shown) and a processing unit (not shown). The light-emitting device 55 emits laser light 57 toward the peripheral portion of the horizontally held wafer W in a radial direction of the wafer W. The laser light 57 is in the form of a line or a surface. The laser light 57 produces a linear trace 58 along a cross-sectional shape of the peripheral portion of the wafer W at an emitted point. The CCD camera 56 has a central axis $\delta$ inclined at a predetermined angle with respect to a surface of the laser light 57 and photographs the trace 58 from the illustrated position.

FIGS. 15A and 15B are views explanatory of the installed position of the light-emitting device 55 and the CCD camera 56. FIG. 15A is a schematic plan view showing an installed position of the light-emitting device 55 and the CCD camera 56, and FIG. 15B is a schematic side view of FIG. 15A. As shown in FIG. 15A, the laser light 57 is applied linearly along an axis $\alpha$ in the radial direction of the wafer W. The CCD camera 56 is arranged in a direction of the axis $\delta$ that is not perpendicular or parallel to the axis $\alpha$. The axis $\delta$ is perpendicular to an axis $\beta$, which is inclined at an angle $\theta$ with respect to the axis $\alpha$. As shown in FIG. 15B, the axis $\delta$ is not perpendicular or parallel to an axis Zs extending vertically downward. Thus, the axis $\delta$ is inclined at a predetermined angle with respect to the axis Zs.

The trace 58 is photographed by the CCD camera 56, and the photographed image is processed by the image processing device. Then, coordinates of the trace are digitalized in the photographed image. Further, the processing unit performs an arithmetic process (e.g., rotation arithmetic process) on the coordinates of the trace in the photographed image and an inclination angle $\theta$ of a plane of the laser light (Z-$\alpha$ plane) with respect to a plane perpendicular to the installation axis $\delta$ of the CCD camera 56 (Z-$\beta$ plane). Thus, original coordinates of the trace 58 are calculated. Specifically, as shown in FIG. 15C, coordinates of the trace 58' on the Z-$\alpha$ plane, which is a trace of the laser light in the photographed image, are rotated through an angle of $\theta$ so as to be projected on the Z-$\beta$ plane. The coordinates of the trace 58 obtained on the Z-$\beta$ plane by this arithmetic process become coordinate data of the actual light trace 58 formed on the peripheral portion of the wafer W, i.e., coordinate data of the cross-sectional shape of the peripheral portion of the wafer W.

A fifth embodiment of the measurement unit will be described. FIG. 16A is a schematic plan view showing a measurement unit 30-5 according to the fifth embodiment, and FIG. 16B is a schematic side view of FIG. 16A. The measurement unit 30-5 shown in FIGS. 16A and 16B has a surface condition measurement mechanism for measuring surface conditions of a peripheral portion of a wafer W and detecting defective portions. Specifically, the measurement unit 30-5 includes a substrate holding and rotating mechanism 61, a peripheral portion measurement device 59 for measuring surface conditions of a peripheral portion of the wafer W and detecting defective portions, a notch measurement device 60 for measuring surface conditions of a notch portion of the wafer W and detecting defective portions, an image processing device (not shown) for processing images photographed by the peripheral portion measurement device 59 and the notch measurement device 60, and a processing unit (not shown) for processing data obtained by the image processing device. The peripheral portion measurement device 59 photographs images of the peripheral portion of the wafer W held by the substrate holding and rotating mechanism 61. The notch measurement device 60 photographs images of the notch portion of the wafer W.

The peripheral portion measurement device 59 includes a lighting device 59a for applying light to the peripheral portion of the wafer W and a plurality of image cameras 59b for photographing reflected light from the peripheral portion of the wafer W. As shown in FIG. 16B, the image cameras 59b are disposed at different positions in a thickness direction of the peripheral portion of the wafer W so as to photograph reflected light from the peripheral portion of the wafer W with a plurality of angles. Further, the notch measurement device 60 includes a lighting device 60a for applying light to a notch N of the wafer W and a plurality of image cameras 60b for photographing reflected light from the notch N. The image cameras 60b are disposed such that reflected light from the notch N which has been emitted from the lighting device 60a is in a range of a bright field. The image cameras 60b are arranged at different positions so as to photograph reflected light from different portions of the notch N in the thickness direction and the width direction.

In the measurement unit 30-5, the peripheral portion of the wafer W is measured as follows. First, the wafer W is rotated by the substrate holding and rotating mechanism 61 to move the notch N of the wafer W into a measurement position of the notch measurement device 60. At that state, the image cameras 60b photograph images of reflected light from the notch N. The images are processed in the image processing device, and intensity of the reflected light is analyzed in the images by the processing unit. Thus, surface conditions of the notch N are measured so that any defects on a surface of the notch N can be detected. In order to measure the peripheral portion of the wafer W, while the wafer is rotated by the substrate holding and rotating mechanism 61, the image cameras 59b continuously photograph images of reflected light from the peripheral portion of the wafer W. The images are processed in the image processing device, and intensity of the reflected light is analyzed in the images by the processing unit. Thus, surface conditions of the peripheral portion of the wafer W are measured so that any defects can be detected on the peripheral portion of the wafer W. In this manner, it is possible to detect pollutants or needle projections remaining on the peripheral portion of the polished wafer W.

In the above embodiments, the measurement unit has been described with a diameter measurement mechanism for measuring a diameter of a wafer, a cross-sectional shape measurement mechanism for measuring a cross-sectional shape of a peripheral portion of a wafer, and a surface condition measurement mechanism for measuring surface conditions of a peripheral portion of a wafer and detecting defective portions. These mechanisms in the measurement unit may be combined suitably with each other and incorporated into one measurement unit. For example, the measurement unit may have only a diameter measurement mechanism as one of the simplest measurement units.

Figure 17:
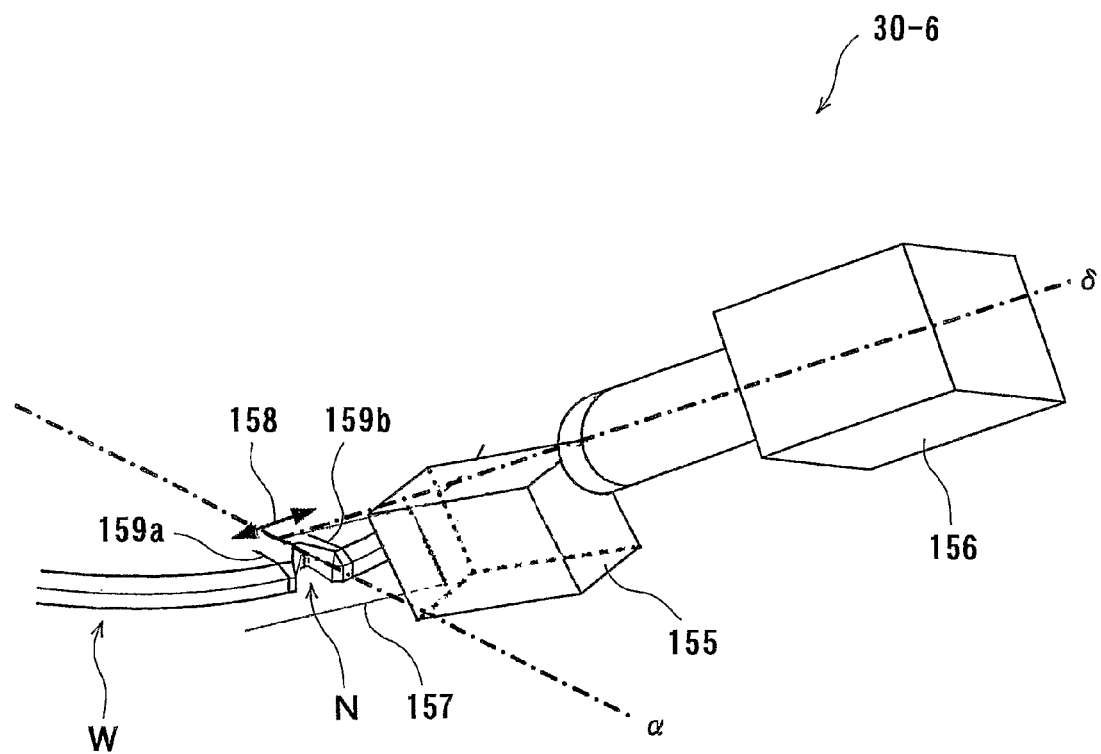
FIG. 17 is a perspective view schematically showing a measurement unit according to a sixth embodiment of the present invention.

A sixth embodiment of the measurement unit will be described. FIG. 17 is a perspective view schematically showing a measurement unit 30-6 according to the sixth embodiment. The measurement unit 30-6 shown in FIG. 17 has a three-dimensional shape measurement mechanism for measuring a three-dimensional shape of a notch N of the wafer W. Specifically, the measurement unit 30-6 includes a substrate holding and rotating mechanism 61, a light-emitting device (laser light-emitting device) 155 disposed above a predetermined position of the notch N of the wafer W held by the substrate holding and rotating mechanism 61, and a CCD camera 156 as an image acquisition device disposed above the notch N of the wafer W. The CCD camera 156 and the light-emitting device 155 are connected to an image processing device (not shown) and a processing unit (not shown).

The substrate holding and rotating mechanism 61 includes a notch detection mechanism (not shown) for detecting the notch N of the wafer W. The notch N of the wafer W held by the substrate holding and rotating mechanism 61 is detected by the notch detection mechanism. Then, the wafer W is rotated by the substrate holding and rotating mechanism 61 so that the notch N of the wafer W is aligned with a measurement position for the CCD camera 156 and the light-emitting device 155. Such a notch detection mechanism is well known, and details of the notch detection mechanism will be omitted.

The CCD camera 156 and the light-emitting device 155 are disposed diagonally above the notch N. The light-emitting device 155 emits laser light 157 toward the notch N of the horizontally held wafer W. The laser light 157, is in the form of a line. The laser light 157 produces a linear trace on the notch N of the wafer W and near its vicinity at an emitted point. The light-emitting device 155 is configured to move applied laser light 157 in directions 158. As shown in FIG. 17, the laser light 157 is applied in a range from a start line 159a near the notch N to an end line 159b opposite of the notch N to the start line 159a. The light-emitting device 155 includes optical components such as a light source, lenses, slits, and galvanometer mirrors. The light-emitting device 155 is configured to apply parallel light 157 is in the form of a line and move the light 157 in a direction perpendicular to the parallel light 157.

Figure 18A:
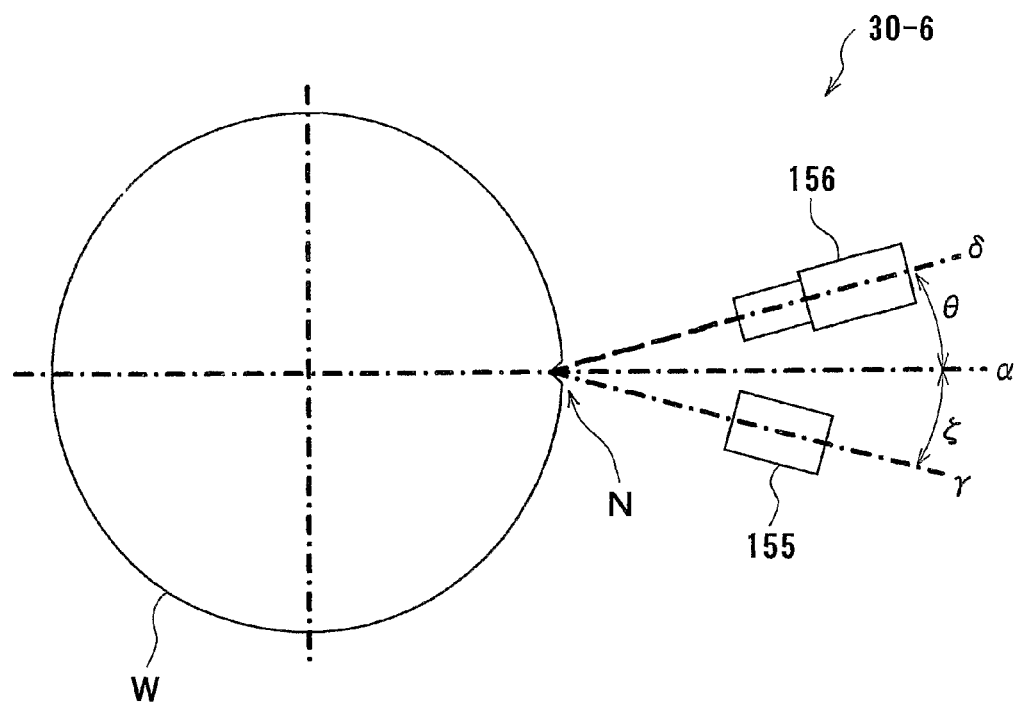
FIG. 18A is a schematic plan view showing an installed position of a light-emitting device and a CCD camera in the measurement unit shown in FIG. 17.
Figure 18B:
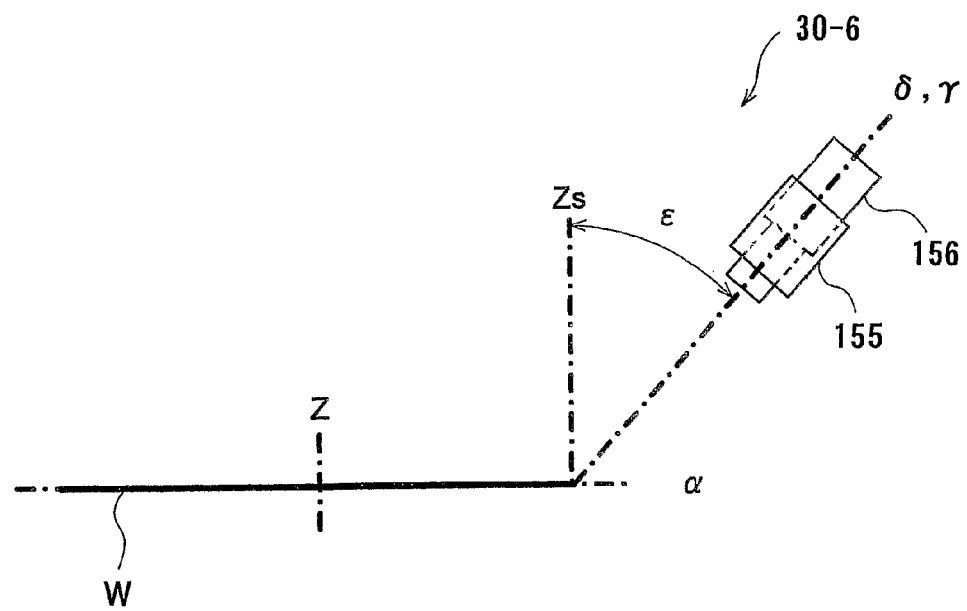
FIG. 18B is a schematic side view of FIG. 18A.

FIGS. 18A and 18B are views explanatory of the installed positions of the light-emitting device 155 and the CCD camera 156. FIG. 18A is a schematic plan view showing an installed state of the light-emitting device 155 and the CCD camera 156, and FIG. 18B is a schematic side view of FIG. 18A. As shown in FIG. 18A, the CCD camera 156 is arranged in a direction of an axis $\delta$ that is inclined at an angle $\theta$ with respect to an axis $\alpha$ that extends from the center of the wafer W through the notch N in a radial direction of the wafer W. Similarly, the light-emitting device 155 is arranged in a direction of an axis $\gamma$ that is inclined at an angle $\zeta$ with respect to the axis $\alpha$. Further, as shown in FIG. 18B, the axes $\delta$ and $\gamma$ are inclined at an angle $\epsilon$ with respect to an axis Zs that is perpendicular to the surface of the wafer W.

When the measurement unit 30-6 has one light-emitting device 155 and one CCD camera 156, it is possible to obtain data on an upper half of the wafer W from the centerline in the thickness direction. However, a lower half of the wafer W is not in a laser-applied area of the light-emitting device 155 or a photographed area of the CCD camera 156. Accordingly, in a case where data on the lower half of the wafer W are needed, an additional light-emitting device and an additional CCD camera may be disposed at symmetrical positions of the light-emitting device 155 and the CCD camera 156 with respect the centerline in the thickness direction. In such a case, data on the lower half of the wafer W can be obtained in addition to the data on the upper half of the wafer W. These data can be combined to produce a three-dimensional data by arithmetic processing. Alternatively, the measurement unit 30-6 may include an additional mechanism for moving the wafer W so as to be inclined with respect to the light-emitting device 155 and the CCD camera 156.

The CCD camera 156 photographs laser light 157 being emitted from the light-emitting device 155 and moved near the notch N as a video image. The image processing device, which is connected to the CCD camera, recognizes a trace of the applied light 157 by variations of the brightness of the laser light 157. The processing unit replaces the trace into three-dimensional data of the shape of the notch N based on the position of the notch N, the three-dimensional positions of the light-emitting device 155 and the CCD camera 156, and a moving speed of the laser light 157. Thus, the shape of the notch N can be measured as three-dimensional data in non-contact manner. Various three-dimensional measurement methods have been developed for such image processing and arithmetic processing. For example, a triangulation method and a light-section method can be employed for such image processing and arithmetic processing.

The three-dimensional measurement data can be utilized to determine polishing conditions in the polishing unit. For example, the three-dimensional measurement data may be converted into two-dimensional data of a desired cross-sectional shape of the notch or a plane shape as seen from above the wafer W to automatically calculate a polishing angle. Further, the polishing amount of the notch N can be calculated by measuring three-dimensional shapes of the notch before and after the polishing process.

In the present embodiment, the three-dimensional shape of the notch N is measured. However, the above arrangement and method can be employed to measure three-dimensional shapes of the peripheral portion of the wafer W other than the notch N. In this case, the three-dimensional measurement data can also be utilized to determine polishing conditions in the polishing unit.

FIG. 19 shows an example in which the measurement unit 30 in the above embodiments is installed in the substrate processing apparatus 1. In FIG. 19, the substrate holding and rotating mechanism 61 represents the measurement unit 30 for the purpose of illustration. The measurement unit 30 may be provided singly. As shown in FIG. 19, a wafer stage 65 for receiving the wafer W may be provided above the measurement unit 30. Specifically, the measurement unit 30 is housed in a frame 66, and the wafer stage 65 is provided on an upper surface 66a of the frame 66. The wafer stage 65 has a plurality of mount pins 65a on which an outer circumferential portion of a wafer W is placed. Thus, the wafer stage 65 can be used as a temporary stage to temporarily receive a wafer W transferred by a hand of the first transfer robot 20A and transfer the wafer W to a hand of the second transfer robot 20B. Alternatively, the wafer stage 65 can be used as a standby stage to hold a subsequent wafer W when a previous wafer W occupies the measurement unit 30. The frame 66 has a sidewall 66b with a shutter 67 in the form of a door. When the shutter 67 is opened, a wafer held by the first or second transfer robot 20A or 20B can be introduced into the frame 66 and placed on the substrate holding and rotating mechanism 61 of the measurement unit 30 for measurement. A shutter (not shown) is also provided on a sidewall of the frame 66 opposite to the sidewall 66b having the shutter 67. The first transfer robot 20A has accesses to one of the shutters, whereas the second transfer robot 20B has accesses to the other of the shutters.

Thus, since the wafer stage 65 is provided above the measurement unit 30, both of the measurement unit 30 and the wafer stage 65 can be disposed in a space to which both of the first and second transfer robots 20A and 20B have access. Accordingly, it is possible to reduce a space required for the substrate processing apparatus 1. Further, a wafer can be transferred efficiently in an optimized route as will be described in processing patterns of the substrate processing apparatus 1. Thus, it is possible to improve a throughput of the substrate processing apparatus 1.

Figure 20:
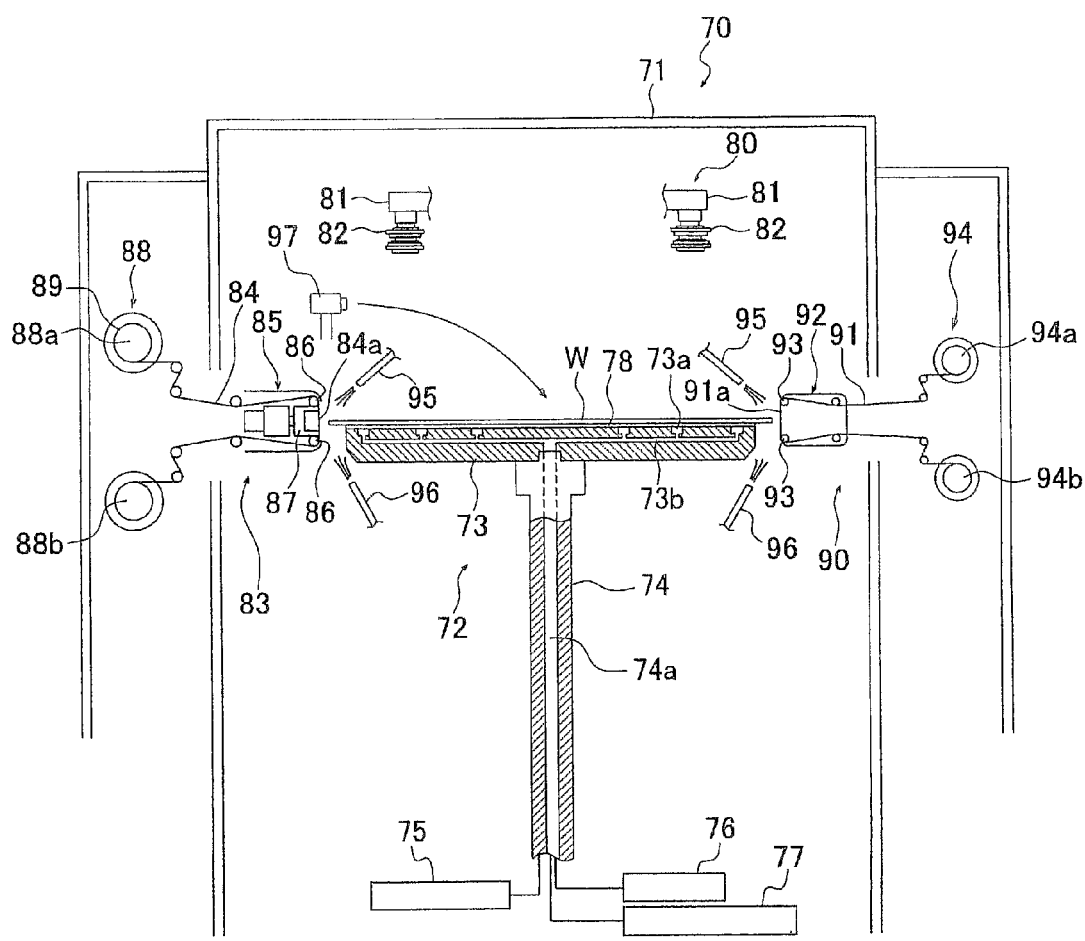
FIG. 20 is a cross-sectional side view schematically showing a polishing unit in the substrate processing apparatus shown in FIG. 2.

Next, structures of the first polishing unit 70A and the second polishing unit 70B will be described below. The first and second polishing units 70A and 70B have the same structure, which will be described in connection with a polishing unit 70 shown in FIG. 20. FIG. 20 is a cross-sectional side view schematically showing the polishing unit 70. As shown in FIG. 20, the polishing unit 70 has a frame 71 housing various components. The polishing unit 70 includes a substrate holding and rotating mechanism 72 for attracting and holding a rear face of a wafer W under vacuum, a substrate transfer mechanism 80 for centering the wafer W and transferring the wafer W, a bevel polishing device 83 for polishing a bevel portion of the wafer W, and a notch polishing device 90 for polishing a notch of the wafer W.

As shown in FIG. 20, the substrate holding and rotating mechanism 72 has a substrate holding table 73 and a support shaft 74 for supporting the substrate holding table 73. The substrate holding table 73 has an upper surface with grooves 73a for vacuum attraction of the wafer W. The support shaft 74 is coupled to a rotation drive device 75, which integrally rotates the substrate holding table 73 and the support shaft 74. The grooves 73a in the substrate holding table 73 communicate with communication passages 73b formed in the substrate holding table 73. The communication passages 73b communicate with a communication passage 74a formed in the support shaft 74. The communication passage 74a is connected to a vacuum line 76 and a compressed air supply line 77. Further, the substrate holding table 73 and the support shaft 74 are coupled to a vertical movement mechanism (not shown), which moves the substrate holding table 73 in a vertical direction.

Further, an attraction pad 78 made of polyurethane elastic material is attached to an upper surface of the substrate holding table 73 so as to cover the grooves 73a of the substrate holding table 73. The attraction pad 78 has a number of small through holes (not shown) formed therein so as to communicate with the grooves 73a of the substrate holding table 73. Accordingly, when the through holes of the attraction pad 78 are evacuated via the vacuum line 76, the wafer W placed on the substrate holding table 73 is attracted on the upper surface of the attraction pad 78 under vacuum. The attraction pad 78 serves to produce vacuum between the wafer W and the substrate holding table 73 and to absorb impact when the wafer W is placed on the substrate holding table 73.

The substrate transfer mechanism 80 is disposed above the substrate holding and rotating mechanism 72. The substrate transfer mechanism 80 has a pair of arms 81 and 81. Each of the arms 81 and 81 has a plurality of chuck members 82 each having a recessed surface corresponding to the bevel portion of the wafer W. The arms 81 and 81 can be opened into an open position and closed into a close position. The wafer W is clamped at the close position by the chuck members 82 and released at the open position by the chuck members 82. When the wafer W is clamped by the arms 81 and 81, the wafer W is centered. The substrate holding table 73 is lifted by the vertical movement mechanism. The wafer received and centered by the substrate transfer mechanism 80 is attracted by the substrate holding table 73. Then, the substrate holding table 73 is lowered to a polishing position for a polishing process.

The bevel polishing device 83 has a bevel polishing head 85 for pressing a polishing tape 84 against the bevel portion of the wafer W and a polishing tape feed mechanism 88. The polishing tape feed mechanism 88 includes a feed reel 88a for feeding the polishing tape 84 to the bevel polishing head 85 and a takeup reel 88b for recovering the polishing tape 84 from the bevel polishing head 85. The bevel polishing head 85 has a pair of feed rollers 86 and 86 for holding the polishing tape 84 therebetween at a position facing the substrate holding table 73. Thus, the polishing tape 84 extends between a pair of the feed rollers 86 so that the bevel portion of the wafer W is brought into contact with a polishing surface 84a of the polishing tape 84. The bevel polishing head 85 has a base 87 disposed on a rear side of the polishing tape 84 extending between the feed rollers 86 and 86. The base 87 may have an elastic member (not shown) attached to a surface of the base 87 which contacts the polishing tape 84. The bevel polishing head 85 can be moved in a radial direction of the wafer W by a movement mechanism (not shown). The polishing surface 84a of the polishing tape 84 is pressed against the bevel portion of the wafer W by a force of the base 87 to press the polishing tape 84 from the rear side and a tension of the polishing tape 84 itself.

The polishing tape 84 is formed by a beltlike member having a predetermined width and a length of about several tens of meters. The polishing tape 84 is wound around a cylindrical core member 89. The core member 89 is attached to the feed reel 88a. The polishing tape 84 extends between the pair of the feed rollers 86 and 86 in the bevel polishing head 85 in a state such that the polishing surface 84a faces outward. Then, the polishing tape 84 is attached to the takeup reel 88b. The takeup reel 88b is coupled to a rotation drive mechanism (not shown) such as a motor. The polishing tape 84 can be wound up and recovered with a predetermined tension applied thereto. When the bevel portion is to be polished, the polishing tape 84 is sequentially fed from the feed reel 88a to continuously provide a new polishing surface 84a to the bevel polishing head 85.

Resin material in which abrasive particles are dispersed is applied to a surface of a tape base and solidified to form the polishing surface 84a of the polishing tape 84. Examples of the abrasive particles include diamond and SiC. Types and grain size of abrasive particles are selected according to the type of wafer to be polished or a required degree of polishing. For example, diamond having a grain size of #4000 to #20000 or SiC having a grain size of #4000 to #10000 can be used as abrasive particles. Further, a beltlike polishing cloth having no particles attached to its surface may be used instead of the polishing tape 84.

When a side surface of the bevel portion is polished with a polishing tape 84 having a small grain size, the wafer can be formed so as to have a desired diameter. In a case where a rough polishing process and a finish polishing process are performed in different polishing units 70, a polishing material having a low count (i.e., a rough polishing material of abrasive particles having a large particle diameter) is applied to a polishing tape 84, and the polishing tape 84 is mounted to the bevel polishing device 83 in a polishing unit 70 for rough polishing. At that time, a polishing material having a high count (i.e., a fine polishing material of abrasive particles having a small particle diameter) is applied to a polishing tape 84, and the polishing tape 84 is mounted to the bevel polishing device 83 in another polishing unit 70 for finish polishing. Thus, a plurality of polishing unit 70 are separately used for their purposes.

Examples of a polishing material having a low count include a polishing material of abrasive particles having an average particle diameter of 5 µm and a grain size of about #3000. Examples of a polishing material having a high count include a polishing material of abrasive particles having an average particle diameter of 0.2 µm and a grain size of about #20000. Generally, a polishing material of abrasive particles having a grain size larger than about #6000 is used for shaping, and a polishing material of abrasive particles having a grain size smaller than about #6000 is used for adjustment of the surface conditions.

Figure 21A:
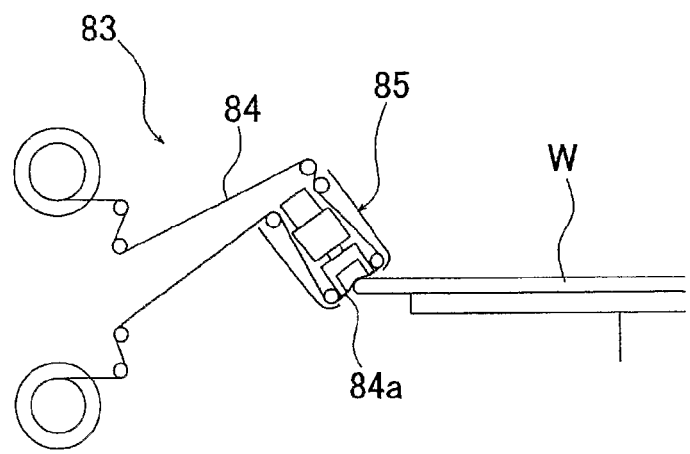
FIGS. 21A through 21C are schematic views explanatory of operation of a bevel polishing head in the polishing unit shown in FIG. 20.
Figure 21B:
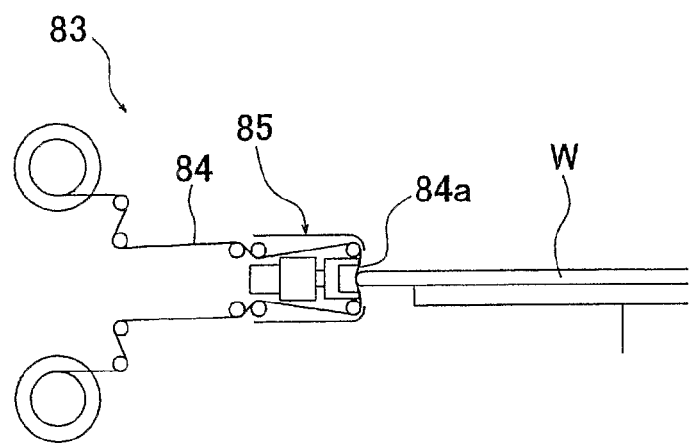
Figure 21C:
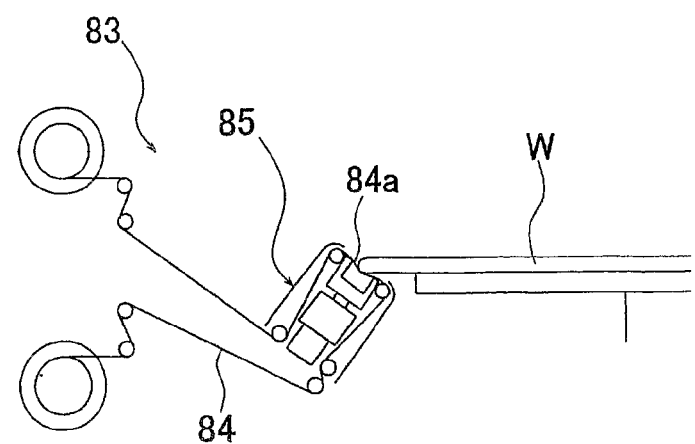

FIGS. 21A through 21C are schematic views explanatory of operation of the bevel polishing head 85. The bevel polishing device 83 has a swing mechanism for swinging the bevel polishing head 85 about a polished area on the bevel portion of the wafer W in a vertical direction. Thus, the polishing surface 84a of the polishing tape 84 can be brought into contact with the polished area on the bevel portion of the wafer W from positions inclined at predetermined angles in the vertical direction with respect to the wafer surface. Accordingly, as shown in FIG. 21A, an upper inclined surface of the bevel portion can be polished in a state such that the bevel polishing head 85 is inclined downward at a predetermined angle with respect to the wafer surface. As shown in FIG. 21B, a side surface of the bevel portion can be polished by directing the bevel polishing head 85 in a horizontal direction. As shown in FIG. 21C, a lower inclined surface of the bevel portion can be polished in a state such that the bevel polishing head 85 is inclined upward at a predetermined angle with respect to the wafer surface. Further, by making fine adjustments to the inclination angle of the bevel polishing head 85, the upper and lower inclined surfaces of the bevel portion, the side surface of the bevel portion, and boundaries thereof can be polished so as to have desired angles and shapes.

As shown in FIG. 20, the notch polishing device 90 has a notch polishing head 92 for pressing a polishing tape 91 against the notch of the wafer W and a polishing tape feed mechanism 94. The notch polishing device 90 includes a movement mechanism (not shown) for moving the notch polishing head 92 in the radial direction of the wafer W. The polishing tape feed mechanism 94 includes a feed reel 94a for feeding the polishing tape 91 to the notch polishing head 92 and a takeup reel 94b for recovering the polishing tape 91 from the notch polishing head 92. The notch polishing head 92 has a pair of feed rollers 93 and 93 for holding the polishing tape 91 therebetween. Thus, the polishing tape 91 extends between a pair of the feed rollers 93 and 93 so that the notch is brought into contact with a polishing surface 91a of the polishing tape 91. The polishing tape 91 used in the notch polishing device 90 may be made of the same material as the polishing tape 84 used in the bevel polishing device 83. The polishing tape 91 has a width corresponding to the shape of the notch of the wafer W. The polishing tape 91 for notch polishing has a width smaller than that of the polishing tape 84 for bevel polishing. As with the bevel polishing device 83, the notch polishing device 90 also has a swing mechanism for swinging the notch polishing head 92 about a polished area on the notch of the wafer W in a vertical direction, which is not illustrated or described in detail. Thus, the polishing surface 91a of the polishing tape 91 can be brought into contact with the polished area on the notch from positions inclined at predetermined angles in the vertical direction with respect to the wafer surface. Accordingly, the notch of the wafer W can be polished along the shape of its surface so as to have desired angles and shapes. Further, the notch polishing device 90 includes a notch detection mechanism (not shown) for detecting the notch of the wafer W.

As shown in FIG. 20, the polishing unit 70 has polishing water supply nozzles 95 and 96 disposed near the polishing locations on the upper surface and the lower surface of the wafer W for supplying water (polishing water) such as ultrapure water. Further, the polishing unit 70 also has a polishing water supply nozzle 97 disposed above the substrate holding table 73 for supplying polishing water to a central area of the upper surface of the wafer W. During polishing the bevel portion and the notch of the wafer W, polishing water is supplied from the polishing water supply nozzles 95 and 96 to prevent particulate polishing wastes, which are caused by polishing, from being attached to the upper surface and the lower surface of the wafer W. Polishing water is supplied from the polishing water supply nozzle 97 toward the central area of the wafer W. Since the wafer W is rotated during polishing, the supplied polishing water flows from the central area of the wafer W toward the outer circumferential portion of the wafer W. Accordingly, the polishing wastes are swept away toward the outer circumferential portion of the wafer W. The lower polishing water supply nozzles 96 are configured to supply polishing water to exposed areas on a rear face of the wafer W which projects radially outward from the substrate holding table 73. When the polishing water is supplied to inner portions of the exposed areas, the supplied polishing wafer flows toward the outer circumferential portion according to rotation of the wafer W, thereby sweeping away polishing wastes toward the outer circumferential portion of the wafer W.

The polishing water supplied from the polishing water supply nozzles 95 and 96 serves not only to prevent contamination on the upper and lower surfaces of the wafer W due to polishing wastes but also to remove heat produced by friction during polishing so as to cool the wafer W. Thus, by adjusting the temperature of the polishing water to be supplied, heat can be removed from the polished areas of the wafer W to achieve a stable polishing process.

The polishing unit 70 may have a polishing endpoint detection device to manage an endpoint of the polishing process. For example, an endpoint of the polishing process may be detected in the following manner. Light (laser or LED) having predetermined shape and intensity is applied to an area of the peripheral portion of the wafer W which is not brought into contact with the bevel polishing head 85 or the notch polishing head 92, in a normal direction of the surface of the wafer W on which semiconductor devices are formed by an optical device (not shown). Then, scattered light is measured to detect irregularities on the bevel portion. An endpoint of a polishing process can be detected based on the measured irregularities. Alternatively, temperature variations of the peripheral portion of the wafer W may be monitored to detect an endpoint of a polishing process. Further, an endpoint of a polishing process for the bevel portion or the notch can be managed by the polishing time.

A polishing process in the polishing unit 70 having the above arrangement will be described below. When a wafer W to be polished is introduced into the frame 71 and delivered to the substrate transfer mechanism 80, the arms 81 and 81 are closed. Thus, the wafer W is clamped and centered in a close state of the arms 81 and 81. Then, the substrate holding table 73 is lifted to a position of the substrate transfer mechanism 80, and the wafer W held by the arms 81 and 81 is attracted to the attraction pad 78 under vacuum. Concurrently with the vacuum attraction, the arms 81 and 81 are opened so as to release the wafer W in an open state. Thus, the wafer W is held on the upper surface of the substrate holding table 73. Thereafter, the substrate holding table 73 which holds the wafer W is lowered to a position shown in FIG. 20. Then, the rotation drive device 75 is driven to rotate the wafer W together with the substrate holding table 73.

When bevel polishing of the wafer W is to be conducted at that state, the polishing tape 84 is supplied from the feed reel 88*a* of the bevel polishing device 83 so as to dispose an unused polishing surface 84*a* between the feed rollers 86 and 86 of the bevel polishing head 85. Then, the movement mechanism feeds the bevel polishing head 85 toward the wafer W. The polishing surface 84*a* of the polishing tape 84 is brought into contact with the bevel portion of the wafer W to polish the bevel portion of the wafer W. At that time, the swing mechanism provided in the bevel polishing device 83 is driven to vertically swing the bevel polishing head 85 during polishing. Thus, it is possible to polish not only the bevel portion but also the edge portion of the wafer W.

When notch polishing of the wafer W is to be conducted, the notch of the wafer W is detected by the notch detection device provided in the notch polishing device 90 and then aligned with a polishing position of the notch polishing device 90 by rotation of the wafer W. After the alignment, the polishing tape 91 is supplied from the feed reel 94*a* of the notch polishing device 90 so as to dispose an unused polishing surface 91*a* between the feed rollers 93 and 93 of the notch polishing head 92. Then, the movement mechanism feeds the notch polishing head 92 toward the wafer W. The polishing surface 91*a* of the polishing tape 91 is brought into contact with the notch of the wafer W to polish the notch of the wafer W. At that time, the swing mechanism provided in the notch polishing device 90 is driven to vertically swing the notch polishing head 92 during polishing. Further, the polishing tape 91 may be moved back and forth with short distances by the polishing tape feed mechanism 94 while the polishing tape 91 is brought into sliding contact with the notch of the wafer W. In this manner, it is possible to polish the notch of the wafer W so as to correspond to its shape.

Next, an arrangement of the primary cleaning unit 100 will be described below. FIG. 22 is a schematic perspective view showing the primary cleaning unit 100. As shown in FIG. 22, the primary cleaning unit 100 comprises a roll/roll (R/R) slow-rotation cleaning unit. Specifically, the primary cleaning unit 100 has a plurality of spindles 101 for holding a peripheral portion of a wafer W and a pair of roll-type cleaning members (roll sponges) 102*a* and 102*b* disposed above and below the wafer W held by the spindles 101. The spindles 101 are used as holding members each having a rotation mechanism. As shown in FIG. 22, a plurality of spindles 101 (six spindles in the illustrated example) are provided so as to surround the wafer W. Each of the spindles 101 can be moved inward and outward with respect to the wafer W by a drive mechanism (not shown). Each of the spindles 101 has a holding groove 101*a* formed in a side surface near an upper end thereof. The outer circumferential portion of the wafer W is engaged with the holding grooves 101*a* so that the wafer W is held by the spindles 101. The spindles 101 can be rotated by a rotation mechanism (not shown). When the spindles 101 are rotated in the same direction, the wafer W held by the spindles 101 is rotated.

The cleaning members 102*a* and 102*b* are attached to the drive mechanisms 103*a* and 103*b*, respectively. The cleaning members 102*a* and 102*b* can be rotated about their axes and moved in vertical and horizontal directions by the drive mechanisms 103*a* and 103*b*, respectively. The cleaning members 102*a* and 102*b* can be moved downward and upward so as to be brought into contact with the upper and lower surfaces of the wafer W to be cleaned, respectively. When the wafer W is transferred into and from the primary cleaning unit 100, the cleaning members 102a and 102b can be retracted upward and downward, respectively. The primary cleaning unit 100 includes a chemical liquid supply nozzle 104 for supplying an etching liquid (chemical liquid) onto the upper surface (front face) of the wafer W, a cleaning liquid supply nozzle 105 for supplying a cleaning liquid (pure water) onto the upper surface (front face) of the wafer W, a chemical liquid supply nozzle 106 for supplying an etching liquid (chemical liquid) onto the lower surface (rear face) of the wafer W, and a cleaning liquid supply nozzle 107 for supplying a cleaning liquid onto the lower surface (rear face) of the wafer W.

A cleaning process of the primary cleaning unit 100 will be described. When a wafer W is transferred to the primary cleaning unit 100, the wafer W is held and rotated by the spindles 101. Simultaneously, the cleaning members 102a and 102b are moved downward and upward so that they are brought into contact with the upper and lower surfaces of the wafer W. At that state, while the cleaning members 102a and 102b are rotated, they are brought into sliding contact with the upper and lower surfaces of the wafer W. The cleaning liquid supply nozzles 105 and 107 supply cleaning liquids onto the upper and lower surfaces of the wafer W to scrub and clean the entire areas of the upper and lower surfaces of the wafer W.

After the scrubbing, the cleaning members 102a and 102b are retracted upward and downward. The chemical liquid supply nozzles 104 and 106 supply etching liquids onto the upper and lower surfaces of the wafer W to etch (chemically clean) the upper and lower surfaces of the wafer W. Thus, remaining metal ions are removed. At that time, the rotational speed of the spindles 101 to rotate the wafer W is varied as needed. Then, the cleaning liquid supply nozzles 105 and 107 supply cleaning liquids (pure water) onto the upper and lower surfaces of the wafer W to perform replacement with pure water for a predetermined period of time. Thus, the etching liquids are removed from the upper and lower surfaces of the wafer W. At that time, the rotational speed of the spindles 101 to rotate the wafer W is varied as needed.

Next, an arrangement of the secondary cleaning and drying unit 110 will be described below. FIG. 23 is a schematic view showing a spin-dry unit having a cleaning function as the secondary cleaning and drying unit 110. The spin-dry unit 110 shown in FIG. 23 has a substrate holding and rotating mechanism 111, a pencil-type cleaning mechanism 114, and a cleaning liquid supply nozzle 119. The substrate holding and rotating mechanism 111 includes a holding portion 112 having a plurality of stages 112a for clamping an outer circumferential portion of a wafer W, a rotational shaft 113 coupled to a lower portion of the holding portion 112, and a rotation drive mechanism (not shown) coupled to the rotational shaft 113. Thus, the substrate holding and rotating mechanism 111 serves to rotate the wafer W at a predetermined rotational speed. The substrate holding and rotating mechanism 111 has a switch mechanism (not shown) for opening and closing the stages 112a when the wafer W is transferred into and from the substrate holding and rotating mechanism 111.

The pencil-type cleaning mechanism 114 has a swing arm 116 supported at an end thereof by a shaft 115, a rotational shaft 117 extending vertically downward from the other end thereof toward an upper surface of the wafer W being cleaned, and a cleaning member 118 attached to a lower end of the rotational shaft 117. For example, the cleaning member 118 may be formed of a porous PVF sponge. Alternatively, the cleaning member 118 may be made of polyurethane foam.

The shaft 115 can be vertically moved and rotated by a drive mechanism (not shown). When the shaft 115 is rotated, the swing arm 116 is swung. The cleaning member 118 can be moved between a cleaning position at which the cleaning member 118 is brought into contact with the upper surface of the wafer W and a retracting position at which the cleaning member 118 is spaced from the upper surface of the wafer W. Further, the cleaning member 118 is rotated during cleaning by rotation of the rotational shaft 117. The cleaning liquid supply nozzle 119 is configured to supply a cleaning liquid onto the upper surface of the wafer W. The spin-dry unit 110 may include an additional cleaning liquid supply nozzle (not shown) disposed below the wafer W for supplying a cleaning liquid onto the lower surface of the wafer W.

A cleaning and drying process is performed in the secondary cleaning and drying unit 110 as follows. When a wafer W is introduced into the secondary cleaning and drying unit 110, the substrate holding and rotating mechanism 111 holds the wafer W and rotates the wafer W at a low speed of about 100 to 500 rpm. Then, while a cleaning liquid is supplied from the cleaning liquid supply nozzle 119 onto the upper surface of the wafer W, the swing arm 116 is swung over the entire upper surface of the wafer W. Thus, the rotating cleaning member 118 is brought into contact with the upper surface of the wafer W and moved to scrub and clean the wafer W. After completion of the scrubbing, the swing arm 116 is moved to a standby position. Then, the rotational speed of the substrate holding and rotating mechanism 111 is increased to rotate the wafer W at a high speed of about 1500 to 5000 rpm, thereby spin-drying the wafer W. At that time, a clean inert gas may be supplied from a gas supply nozzle (not shown) during spin-drying as needed. In the present example, the cleaning member 118 is used for scrubbing. However, instead of the above scrubbing process, pure water to which ultrasonic vibration has been applied may be supplied from the cleaning liquid supply nozzle 119 for non-contact cleaning to remove particles attached to the surface of the wafer W.

Next, process patterns of wafers in the substrate processing apparatus 1 will be described below.

A first process pattern of wafers will be described below with reference to FIG. 24. In FIG. 24, dotted arrows represent transfer lines of the first transfer robot 20A, whereas solid arrows represent transfer lines of the second transfer robot 20B. When a wafer cassette 12A or 12B, which holds wafers after a CMP process or a Cu deposition process, is placed on the wafer supply/recovery device 11A or 11B of the loading/unloading port 10, the first transfer robot 20A takes a wafer out of the wafer cassette 12A or 12B and transfers it to the measurement unit 30 (Transfer Line 1). In the measurement unit 30, necessary data on the diameter of the wafer, the cross-sectional shape of a peripheral portion of the wafer, and the surface conditions of the wafer are measured before polishing. The second transfer robot 20B transfers the measured wafer from the measurement unit 30 to the first polishing unit 70A (Transfer Line 2). In the first polishing unit 70A, a peripheral portion (a bevel portion and a notch) of the wafer is polished. The second transfer robot 20B transfers the wafer polished in the first polishing unit 70A to the primary cleaning unit 100 (Transfer Line 3), where primary cleaning is conducted on the wafer. The second transfer robot 20B transfers the wafer cleaned in the primary cleaning unit 100 to the secondary cleaning and drying unit 110 (Transfer Line 4), where secondary cleaning and drying are conducted on the wafer. The first transfer robot 20A returns the dried wafer to the wafer cassette 12A or 12B (Transfer Line 5). Alternatively, the dried wafer may be transferred to the measurement unit 30 or the wafer stage 65 by the first or second transfer robot 20A or 20B and then returned to the wafer cassette 12A or 12B by the first transfer robot 20A.

While a wafer that has previously been transferred in the aforementioned first process pattern is polished in the first polishing unit 70A, a next wafer can be transferred and processed in the following second process pattern. Specifically, in the second process pattern, the first transfer robot 20A transfers a wafer from the wafer cassette 12A or 12B to the measurement unit 30 (Transfer Line 1). After the wafer is measured in the measurement unit 30, the second transfer robot 20B transfers the wafer to the second polishing unit 70B (Transfer Line 2'). In the second polishing unit 70B, a peripheral portion (a bevel portion and a notch) of the wafer is polished. The second transfer robot 20B transfers the wafer polished in the second polishing unit 70B to the primary cleaning unit 100 (Transfer Line 3'), where primary cleaning is conducted on the wafer. The second transfer robot 20B transfers the wafer cleaned in the primary cleaning unit 100 to the secondary cleaning and drying unit 110 (Transfer Line 4), where secondary cleaning and drying are conducted on the wafer. The first transfer robot 20A returns the dried wafer to the wafer cassette 12A or 12B (Transfer Line 5). Alternatively, the dried wafer may be transferred to the measurement unit 30 or the wafer stage 65 by the first or second transfer robot 20A or 20B and then returned to the wafer cassette 12A or 12B by the first transfer robot 20A.

The above processes, i.e., the first and second process patterns, can simultaneously be performed for parallel processing, in which different wafers are polished in parallel in the first polishing unit 70A and the second polishing unit 70B. According to parallel processing, the number of wafers processed per unit time can be increased to improve a throughput of the substrate processing apparatus 1. Thus, a rate of operation can be improved.

When parallel processing is conducted, the polishing tapes having the same grain size are used in the first and second polishing units 70A and 70B. For example, such polishing tapes include a polishing tape having a grain size of #6000 to #8000. In the above process patterns, if a wafer is not required to be measured before polishing, then the wafer may be transferred from the first transfer robot 20A to the wafer stage 65 instead of transferring the wafer to the measurement unit 30 in the transfer line 1, (temporarily) placed on the wafer stage 65, and transferred to the second transfer robot 20B.

Next, a third process pattern of wafers will be described below with reference to FIG. 25. In FIG. 25, dotted arrows represent transfer lines of the first transfer robot 20A, whereas solid arrows represent transfer lines of the second transfer robot 20B. The first transfer robot 20A takes a wafer out of the wafer cassette 12A or 12B placed on the loading/unloading port 10 and transfers it to the measurement unit 30 (Transfer Line 11). In the measurement unit 30, necessary data on the diameter of the wafer, the cross-sectional shape of a peripheral portion of the wafer, and the surface conditions of the wafer are measured before polishing. The second transfer robot 20B transfers the measured wafer from the measurement unit 30 to the first polishing unit 70A (Transfer Line 12). In the first polishing unit 70A, a peripheral portion (a bevel portion and a notch) of the wafer is polished. The second transfer robot 20B transfers the wafer polished in the first polishing unit 70A to the second polishing unit 70B (Transfer Line 13), where polishing is further conducted. The second transfer robot 20B transfers the wafer polished in the second polishing unit 70B to the primary cleaning unit 100 (Transfer Line 14), where primary cleaning is conducted on the wafer. The second transfer robot 20B transfers the wafer cleaned in the primary cleaning unit 100 to the secondary cleaning and drying unit 110 (Transfer Line 15), where secondary cleaning and drying are conducted on the wafer. The first transfer robot 20A returns the dried wafer to the wafer cassette 12A or 12B (Transfer Line 16).

The third process pattern is performed for serial processing in which the same wafer is polished sequentially in the first polishing unit 70A and the second polishing unit 70B. According to the serial processing, the first polishing unit 70A and the second polishing unit 70B can be used for respective purposes of polishing. For example, objects attached to a peripheral portion of a wafer or surface roughness of a wafer can be removed in the first polishing unit 70A, and then finish polishing can be conducted on the wafer in the second polishing unit 70B. In the third process patterns, if a wafer is not required to be measured before polishing, then the wafer may be transferred from the first transfer robot 20A to the wafer stage 65 instead of transferring the wafer to the measurement unit 30 in the transfer line 11.

FIG. 26 is a diagram explanatory of other process patterns. In FIG. 26, CL1, CL2, CL3, and CL4 represent the first polishing unit 70A, the second polishing unit 70B, the primary cleaning unit 100, and the secondary cleaning and drying unit 110, respectively. In a fourth process pattern (a), the first transfer robot 20A takes a wafer out of the wafer cassette 12A or 12B and transfers it to the measurement unit 30 or the wafer stage 65. Then, the second transfer robot 20B transfers the wafer from the measurement unit 30 or the wafer stage 65 to the first polishing unit 70A. In the first polishing unit 70A, a peripheral portion (a bevel portion and a notch) of the wafer is polished. The second transfer robot 20B transfers the wafer polished in the first polishing unit 70A to the secondary cleaning and drying unit 110, where secondary cleaning and drying are conducted on the wafer. The dried wafer is transferred to the measurement unit 30 or the wafer stage 65 by the first or second transfer robot 20A or 20B and then returned to the wafer cassette 12A or 12B by the first transfer robot 20A. Alternatively, the dried wafer is returned from the secondary cleaning and drying unit 110 directly to the wafer cassette 12A or 12B by the first transfer robot 20A.

In a fifth process pattern (b), the second transfer robot 20B transfers a wafer to the second polishing unit 70B for polishing, instead of transferring the wafer from the measurement unit 30 or the wafer stage 65 to the first polishing unit 70A in the fourth process pattern (a). At that time, it is possible to conduct parallel processing. Specifically, while a wafer that has previously been transferred can be polished in the first polishing unit 70A according to the fourth process pattern (a), a next wafer can be transferred and polished in the second polishing unit 70B according to the fifth process pattern (b).

In a sixth process pattern (c), the first transfer robot 20A takes a wafer out of the wafer cassette 12A or 12B and transfers it to the measurement unit 30 or the wafer stage 65. Then, the second transfer robot 20B transfers the wafer to the primary cleaning unit 100, where primary cleaning is conducted on the wafer. The second transfer robot 20B transfers the wafer cleaned in the primary cleaning unit 100 to the secondary cleaning and drying unit 110, where secondary cleaning and drying are conducted on the wafer. The dried wafer is transferred to the measurement unit 30 or the wafer stage 65 by the first or second transfer robot 20A or 20B and then returned to the wafer cassette 12A or 12B by the first transfer robot 20A. Alternatively, the dried wafer is returned from the secondary cleaning and drying unit 110 directly to the wafer cassette 12A or 12B by the first transfer robot 20A.

In a seventh process pattern (d), the first transfer robot 20A takes a wafer out of the wafer cassette 12A or 12B and transfers it to the measurement unit 30 or the wafer stage 65.

Then, the second transfer robot 20B transfers the wafer from the measurement unit 30 or the wafer stage 65 to the secondary cleaning and drying unit 110, where secondary cleaning and drying are conducted on the wafer. The dried wafer is transferred to the measurement unit 30 or the wafer stage 65 by the first or second transfer robot 20A or 20B and then returned to the wafer cassette 12A or 12B by the first transfer robot 20A. Alternatively, the dried wafer is returned from the secondary cleaning and drying unit 110 directly to the wafer cassette 12A or 12B by the first transfer robot 20A.

The substrate processing apparatus 1 can both conduct parallel processing and serial processing. The first and second polishing units 70A and 70B can be employed for the respective polishing purposes by properly selecting counts of polishing tapes used in the first and second polishing units 70A and 70B and operating conditions in the first and second polishing units 70A and 70B according to purposes of polishing wafers. Thus, optimal polishing processes can be performed on wafers. In the above process patterns, when the measurement unit 30 is occupied by a wafer that has previously been transferred, a next wafer may be placed temporarily on the wafer stage 65 for standby. In such a case, wafers can efficiently be transferred and processed.

In order to measure a polished wafer in the above process patterns, the wafer dried in the secondary cleaning and drying unit 110 may be transferred to the measurement unit 30 to measure necessary data on the diameter of the wafer, the cross-sectional shape of a peripheral portion of the wafer, and the surface conditions of the wafer are measured before polishing. When a wafer is measured twice, i.e., before and after polishing, even if the measurement unit 30 is occupied by a wafer measured before polishing, a wafer dried in the secondary cleaning and drying unit 110 can be placed temporarily on the wafer stage 65 for measurement after polishing because the substrate processing apparatus 1 has the wafer stage 65. Accordingly, the secondary cleaning and drying unit 110 can subsequently receive a next wafer and conduct secondary cleaning and drying on the next wafer. Thus, it is possible to improve a throughput of the substrate processing apparatus 1.

In the above process patterns, timing of transferring wafers may be adjusted depending upon required processing periods of time in the measurement unit 30, the first polishing unit 70A, the second polishing unit 70B, the primary cleaning unit 100, and the secondary cleaning and drying unit 110. In such a case, the wafers can smoothly be transferred and processed in the substrate processing apparatus 1 to further improve the throughput of the substrate processing apparatus 1.

In the following example, a wafer is polished under polishing conditions which are determined based on measurement results in the measurement unit 30 having the cross-sectional shape measurement mechanism, such as the measurement unit 30-2, 30-3, or 30-4 in the second, third, or fourth embodiment. FIG. 27 shows a cross-sectional shape of a peripheral portion of a wafer W. Polishing conditions including polishing angles M1 and M2 of an upper inclined portion P and a lower inclined portion Q and a polishing angle M3 of a side surface R of a bevel portion of the wafer W are determined based on measured data of the wafer W which are measured in the measurement unit 30 with the cross-sectional shape measurement mechanism before polishing. Further, an expected polishing amount is calculated from the cross-sectional shape of the wafer W and polishing conditions including pressing forces of the polishing surface and rotational speeds of the wafer in the polishing unit 70A or 70B. Thus, a polished shape of the peripheral portion of the wafer W is predicted. If it is determined that unpolished portions will be produced at a boundary V1 between the upper inclined portion P and the side surface R and at a boundary V2 between the lower inclined portion Q and the side surface R from the predicted shape, then polishing conditions (e.g., polishing angles M4 and M5 and polishing time) are determined for polishing the boundaries V1 and V2. In other words, the parts of the peripheral portion of the wafer which are to be polished (e.g., P, Q, R, V1, V2) are ascertained based on the result of the measurement data. Then, the wafer is polished under the determined polishing conditions in the polishing unit 70A or 70B. Thus, the peripheral portion of the wafer can be polished so as to have a desired shape and size.

According to the present invention, the polishing unit 70A or 70B includes a mechanism for changing an angle of the bevel polishing head 85 at a desired value to polish the peripheral portion of the wafer W at a desired polishing angle. The measurement unit 30 has a function to measure the cross-sectional shape of the peripheral portion of the wafer W. The polishing condition decision unit calculates and determines optimal polishing angles based on measurement results of the cross-sectional shape of the peripheral portion of the wafer W which is measured in the measurement unit 30. The polishing unit 70A or 70B employs the determined polishing angles as polishing conditions and polishes the wafer W at optimal angles. Accordingly, it is possible to shorten polishing time.

The above operation has been described as an example in which polishing conditions are determined based on measurement results of the measurement unit 30 having the cross-sectional shape measurement mechanism. In this example, the entire bevel portion of the wafer, i.e., the upper inclined portion P, the lower inclined portion Q, and the side surface R, is polished. However, for example, when only an upper inclined portion P of a bevel portion of a wafer W is required to be polished in a device fabrication process, only a polishing angle M1 is determined, or only polishing angles M1 and M4 of the upper inclined portion P and the boundary V1 are determined. Thus, required polishing conditions are determined for polishing purposes. Further, the diameter of the wafer W may be measured before polishing, and a polishing amount of a side surface R may be determined based on the measurement results to finish the wafer W so as to have a desired diameter. In the case where the wafer is polished based on the measurement results of the measurement unit 30, a polishing method can be selected according to polishing purposes. For example, only a surface of a wafer may be polished so as to follow the shape of the wafer before polishing. A wafer is polished at polishing angles and pressures so as to change the shape of the wafer before polishing, thereby forming the wafer into a desired shape.

The measurement unit 30 having the surface condition measurement mechanism, such as the measurement unit 30-5 in the fifth embodiment, can measure surface conditions of a peripheral portion of a polished wafer and inspect status of removal of objects attached to the peripheral portion of the wafer in the polishing unit 70A or 70B or removal of surface roughness. When a polished wafer is thus measured, it is possible to determine whether or not desired polishing has been conducted in the polishing unit 70A or 70B. Accordingly, operation of the polishing unit 70A or 70B can be managed at an optimal state.

In the case where a polished wafer is measured in the measurement unit 30, the measure wafer is returned from the measurement unit 30 to the wafer cassette 12A or 12B. Thus, all wafers in the wafer cassette 12A or 12B are processed in the substrate processing apparatus 1 and returned to the wafer cassette 12A or 12B. Then, if it is determined from the inspection results of the wafer that the polishing process is insufficient, then polishing conditions in the first or second polishing unit 70A or 70B are changed based on the measurement results. Thereafter, the wafers in the wafer cassette 12A or 12B can be transferred to the first or second polishing unit 70A or 70B and polished again in the first or second polishing unit 70A or 70B. Only several wafers in the wafer cassette 12A or 12B may first be polished, and polishing conditions may be changed for the rest of wafers based on the inspection results of the polished wafers.

Usually, one wafer cassette houses about 25 wafers of the same type. At the operation, a plurality of wafer cassettes housing the same type of wafers are continuously introduced into a substrate processing apparatus. According to the substrate processing apparatus 1 having the measurement unit 30, polishing conditions in the polishing unit 70A or 70B can be determined based on the inspection results of several wafers in the first wafer cassette in a plurality of wafer cassettes. In this case, wafers housed in subsequent wafer cassettes can continuously be processed without changing or modifying the polishing conditions. Accordingly, a large number of wafers can be housed and processed efficiently. Further, the measurement unit 30 measures and compares shapes of plural wafers before and after polishing. Thus, whether the wafer currently processed is polished to an equal level to a previous wafer that has been processed can be determined statistically to manage performance of the polishing unit 70A or 70B.

As described above, according to the substrate processing apparatus 1 in the embodiments of the present invention, the measurement unit 30 provided within the substrate processing apparatus 1 can measure a state of a peripheral portion of a wafer before and/or after the wafer is polished in the first and second polishing units 70A and 70B. Therefore, it is not necessary to transfer a wafer out of the substrate processing apparatus 1 to inspect or measure the wafer unlike a conventional substrate processing apparatus. Further, a wafer can be measured in parallel to a polishing process in the first or second polishing unit 70A, or 70B. Accordingly, it is possible to improve an efficiency of the polishing process of the wafer in the substrate processing apparatus 1.

Further, the measurement unit 30 can measure a shape of a peripheral portion of a wafer or surface conditions of a wafer with a simpler arrangement and a simpler process as compared to a conventional inspection device. Accordingly, it is possible to accurately measure a peripheral portion of a wafer for a short term. Further, measurement of a peripheral portion of a wafer before and/or after polishing can be performed according to polishing purposes. Accordingly, it is easy to detect a state of a peripheral portion of a wafer and finish the peripheral portion of the wafer so as to have a desired shape. Furthermore, measurement results in the measurement unit 30 can be employed directly for polishing conditions in the first and second polishing units 70A and 70B. When the measurement unit 30 and the measurement method are arranged so as to accord with polishing methods in the first and second polishing units 70A and 70B, polishing conditions can quantitatively be modified based on the measurement results. Thus, desired polishing can be achieved.

In the above embodiments, the measurement unit 30 is provided within the substrate processing apparatus 1 (housing 3). However, the measurement unit may be disposed inside or outside of the substrate processing apparatus as long as the substrate processing apparatus has a measurement unit for measuring a shape of a peripheral portion of a wafer to be polished in a polishing unit or surface conditions of a wafer, can transfer measurement data on the peripheral portion of the wafer which has been measured in the measurement unit to a polishing condition decision unit, and can polish the wafer under polishing conditions determined based on the measurement data in the polishing unit. Accordingly, for example, the measurement unit may be provided away from the substrate processing apparatus, which has a transfer device for transferring a wafer in a clean state between the measurement unit and the substrate processing apparatus and a transmitting device for transmitting measurement data of the measurement unit to a controller of the substrate processing apparatus.

Any shapes or materials that have not been directly described in the specification or illustrated in the drawings are encompassed by the scope of the present invention as long as they achieve the advantageous effects of the present invention.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a substrate processing apparatus having a polishing unit for polishing a peripheral portion of a substrate such as a semiconductor wafer.

The invention claimed is:

1. A substrate processing method comprising:
measuring a peripheral portion of a substrate in a measurement unit to obtain a measurement value, said measuring comprising measuring a cross-sectional shape of the peripheral portion of the substrate;
determining first polishing conditions for an upper inclined portion of a bevel portion, a lower inclined portion of the bevel portion, and a side surface of the bevel portion, said determining the first polishing conditions being based on the measurement value obtained by said measuring of the peripheral portion of the substrate in the measurement unit;
predicting a polished shape of the peripheral portion of the substrate by calculating an expected polishing amount based on the cross-sectional shape of the peripheral portion of the substrate and the first polishing conditions;
judging from the predicted polishing shape whether unpolished portions of the peripheral portion of the substrate will be produced at a first boundary between the upper inclined portion of the bevel portion and the side surface of the bevel portion and at a second boundary between the lower inclined portion of the bevel portion and the side surface of the bevel portion;
determining based on said judging that the unpolished portions will be produced; and
determining second polishing conditions for polishing the unpolished portions of the upper inclined portion of a bevel portion, the lower inclined portion of the bevel portion, the side surface of the bevel portion, the first boundary, and the second boundary, the second polishing conditions including the first polishing conditions and additional polishing conditions; and
polishing the peripheral portion of the substrate based on the second polishing conditions by pressing a polishing tape held by a polishing head against the peripheral portion of the substrate in a polishing unit.

2. The substrate processing method as recited in claim 1, wherein the substrate is a first substrate and the polishing unit is a first polishing unit, said polishing comprising polishing the peripheral portion of the first substrate in the first polishing unit and polishing a peripheral portion of a second substrate in a second polishing unit in parallel to remove contamination and/or surface roughness of the peripheral portions of the first substrate and the second substrate.

3. The substrate processing method as recited in claim 2, wherein the first polishing unit comprises a bevel polishing device for polishing a bevel portion of the first substrate and a notch polishing device for polishing a notch of the first substrate.

4. The substrate processing method as recited in claim 1, wherein the polishing unit is a first polishing unit, said polishing comprising:
  polishing the peripheral portion of the substrate in the first polishing unit to remove contamination and/or surface roughness of the peripheral portion of the substrate; and
  polishing the peripheral portion of the substrate in a second polishing unit to remove contamination and/or surface roughness of the peripheral portion of the substrate after said polishing in the first polishing unit.

5. The substrate processing method as recited in claim 4, wherein each of the first polishing unit and the second polishing unit comprises a bevel polishing device for polishing a bevel portion of the substrate and a notch polishing device for polishing a notch of the substrate.

6. The substrate processing method as recited in claim 1, wherein the peripheral portion of the substrate includes a bevel portion and a notch portion of the substrate.

7. The substrate processing method as recited in claim 1, further comprising:
  cleaning the substrate in a cleaning unit after said polishing; and
  drying the substrate in a drying unit after said cleaning.

8. The substrate processing method as recited in claim 7, wherein said measuring further comprises pre-polishing measuring, said substrate processing method further comprising post-polishing measuring comprising measuring the peripheral portion of the substrate in the measurement unit after said drying.

* * * * *